(12) United States Patent
Kim et al.

(10) Patent No.: US 12,213,251 B2
(45) Date of Patent: Jan. 28, 2025

(54) PRINTED CIRCUIT BOARD

(71) Applicant: SAMSUNG ELECTRO-MECHANICS CO., LTD., Suwon-si (KR)

(72) Inventors: Sang Hoon Kim, Suwon-si (KR); Young Kuk Ko, Suwon-si (KR); Gyu Mook Kim, Suwon-si (KR); Hea Sung Kim, Suwon-si (KR); Chi Won Hwang, Suwon-si (KR); Suk Chang Hong, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/691,780

(22) Filed: Mar. 10, 2022

(65) Prior Publication Data

US 2023/0147912 A1 May 11, 2023

(30) Foreign Application Priority Data

Nov. 10, 2021 (KR) .......................... 10-2021-0154152

(51) Int. Cl.
*H05K 1/11* (2006.01)

(52) U.S. Cl.
CPC ... *H05K 1/113* (2013.01); *H05K 2201/09563* (2013.01); *H05K 2201/096* (2013.01)

(58) Field of Classification Search
CPC ..................... H05K 1/11; H05K 1/113; H05K 2201/09563; H05K 2201/096
USPC ......................................................... 174/262
See application file for complete search history.

(56) References Cited

U.S. PATENT DOCUMENTS

| | | |
|---|---|---|
| 2002/0034620 A1 | 3/2002 | Takezawa et al. |
| 2008/0251942 A1* | 10/2008 | Ohuchi ................. H01L 21/563 257/E23.06 |
| 2009/0027864 A1 | 1/2009 | Cho et al. |
| 2013/0161784 A1 | 6/2013 | Jang et al. |
| 2015/0334850 A1 | 11/2015 | Hayashi |
| 2016/0242277 A1* | 8/2016 | Lee ....................... H05K 3/4007 |

FOREIGN PATENT DOCUMENTS

| | | |
|---|---|---|
| CN | 101355847 A | 1/2009 |
| JP | 2009-033084 A | 2/2009 |
| JP | 2015-216293 A | 12/2015 |

OTHER PUBLICATIONS

Office Action dated Nov. 8, 2024, issued in corresponding Chinese Patent Application No. 202210562415.2 with an English translation.
Office Action dated Nov. 8, 2024, issued in corresponding Japanese Patent Application No. 202210562415.2 with an English translation.

* cited by examiner

*Primary Examiner* — Tremesha W Burns
(74) *Attorney, Agent, or Firm* — Morgan, Lewis & Bockius LLP

(57) ABSTRACT

A printed circuit board includes: an insulating layer; a plurality of pads disposed on the insulating layer; and a plurality of insulating walls disposed on the insulating layer, and at least partially covering side surfaces of the plurality of pads, respectively, while being free from surfaces of the plurality of pads, respectively. The plurality of insulating walls are disposed to be spaced apart from each other on the insulating layer.

18 Claims, 47 Drawing Sheets

PRINTED CIRCUIT BOARD

CROSS-REFERENCE TO RELATED APPLICATION(S)

This application claims benefit of priority to Korean Patent Application No. 10-2021-0154152 filed on Nov. 10, 2021 in the Korean Intellectual Property Office, the disclosure of which is incorporated herein by reference in its entirety.

TECHNICAL FIELD

The present disclosure relates to a printed circuit board, for example, a printed circuit board capable of mounting and/or embedding an electronic component.

BACKGROUND

In general, high-performance semiconductor dies use flip-chip mounting technology for high-density mounting. At this point, in accordance with the miniaturization and high performance of semiconductors, there has also been a continuous decrease in distance between connection terminals for mounting a flip chip. Accordingly, there have been continuous increases in precision for sizes of solder resist openings in boards, a level of difficulty in forming solder bumps, and a level of difficulty concerning bridge shorts when dies are bonded to solders.

SUMMARY

An aspect of the present disclosure may provide a printed circuit board that is easy to manufacture and a method for manufacturing the same.

Another aspect of the present disclosure may provide a printed circuit board capable of reducing a bridge short risk and a method for manufacturing the same.

Another aspect of the present disclosure may provide a printed circuit board capable of improving reliability and a method for manufacturing the same.

One of several solutions suggested through the present disclosure is to create a structure in which a side surface of a pad provided for mounting a die is covered by an insulating wall to reduce a bridge short risk or the like and improve reliability.

According to an aspect of the present disclosure, a printed circuit board may include: an insulating layer; a plurality of pads disposed on the insulating layer; and a plurality of insulating walls disposed on the insulating layer, and at least partially covering side surfaces of the plurality of pads, respectively, while being free from surfaces of the plurality of pads, respectively. The plurality of insulating walls may be disposed to be spaced apart from each other on the insulating layer.

According to another aspect of the present disclosure, a printed circuit board may include: an insulating layer; a plurality of pads disposed on the insulating layer; and a plurality of insulating walls disposed on the insulating layer, and at least partially covering side surfaces of the plurality of pads, respectively. Each of the plurality of insulating walls may be thinner than each of the plurality of pads, and the plurality of insulating walls may be disposed to be spaced apart from each other on the insulating layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Electronic Device

Figure 1:
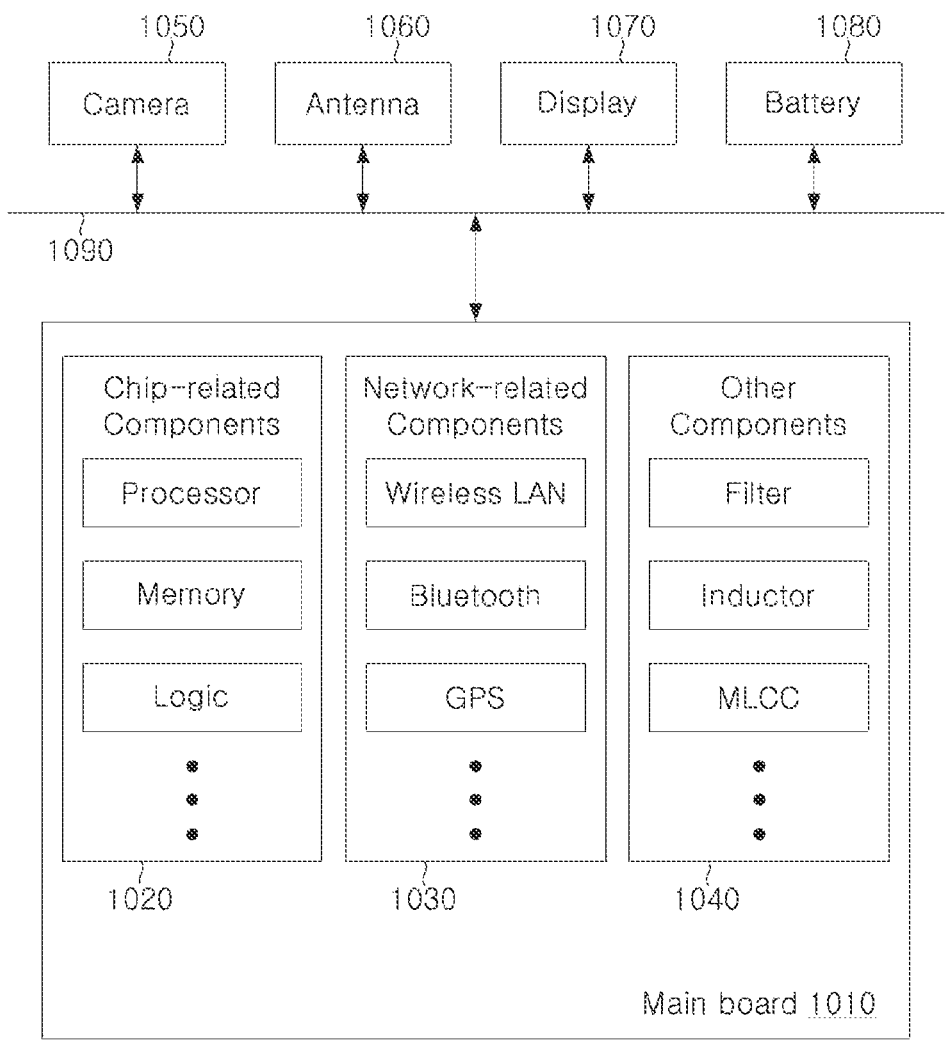
FIG. 1 is a block diagram schematically illustrating an example of an electronic device system.

FIG. 1 is a block diagram schematically illustrating an example of an electronic device system.

Referring to FIG. 1, an electronic device 1000 may accommodate a mainboard 1010 therein. The mainboard 1010 may include chip-related components 1020, network-related components 1030, and other components 1040, which are physically and/or electrically connected thereto. These components may be connected to other electronic components to be described below to form various signal lines 1090.

The chip-related components 1020 may include a memory chip such as a volatile memory (e.g., a dynamic random access memory (DRAM)), a non-volatile memory (e.g., a read only memory (ROM)), or a flash memory; an application processor chip such as a central processor (e.g., a central processing unit (CPU)), a graphics processor (e.g., a graphics processing unit (GPU)), a digital signal processor, a cryptographic processor, a microprocessor, or a microcontroller; and a logic chip such as an analog-digital converter or an application-specific integrated circuit (ASIC). The chip-related components 1020 are not limited thereto, but may also include other types of chip-related electronic components. In addition, the chip-related components 1020 may be combined with each other. The chip-related components 1020 maybe in the form of a package including the chips or electronic components described above.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+(HSPA+), high speed downlink packet access+(HSDPA+), high speed uplink packet access+ (HSUPA+), global system for mobile communications (GSM), enhanced data GSM environment (EDGE), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with each other, together with the chip-related components 1020.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but also include passive elements in chip component type used for various other purposes, and the like. In addition, the other components 1040 maybe combined with each other, together with the chip-related components 1020 and/or the network-related components 1030.

Depending on the type of electronic device 1000, the electronic device 1000 may include other electronic components that may or may not be physically and/or electrically connected to the mainboard 1010. Examples of the other electronic components may include a camera 1050, an antenna 1060, a display 1070, a battery 1080, and the like. The other electronic components are not limited thereto, but may be an audio codec, a video codec, a power amplifier, a compass, an accelerometer, a gyroscope, a speaker, a mass storage unit (e.g., a hard disk drive), a compact disk (CD), a digital versatile disk (DVD), and the like. The other electronic components may also include other electronic components and the like used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
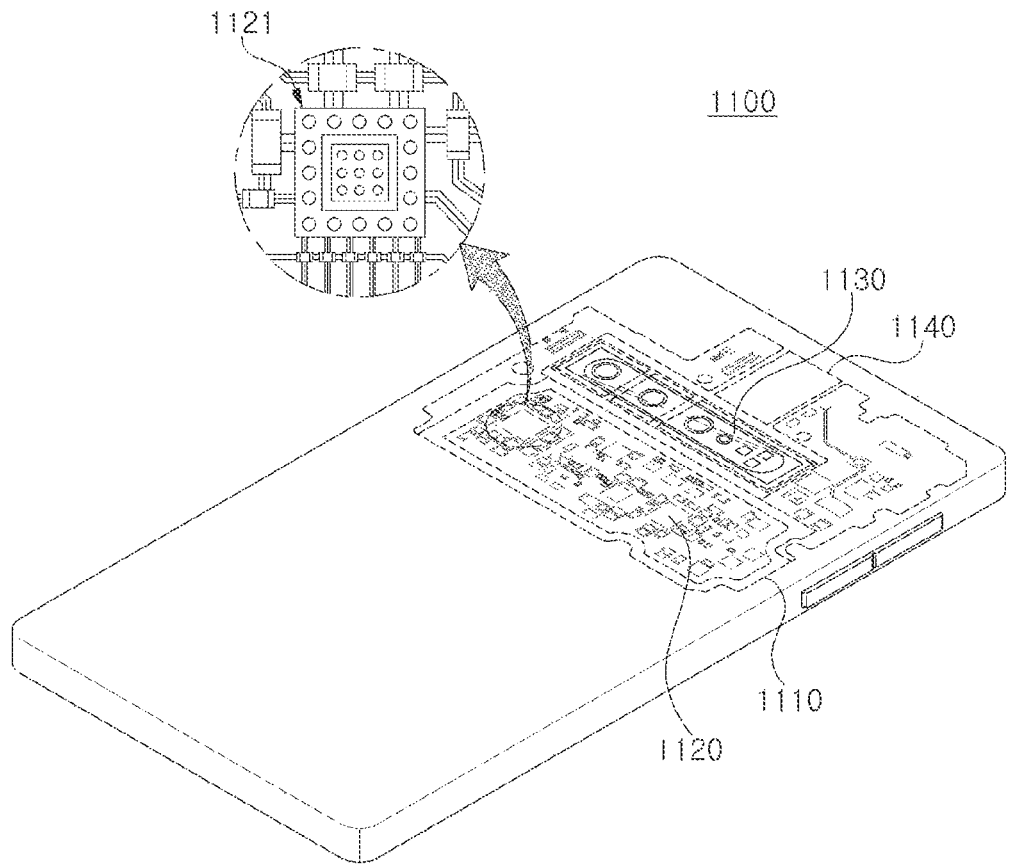
FIG. 2 is a perspective view schematically illustrating an exemplary embodiment of an electronic device.

FIG. 2 is a perspective view schematically illustrating an exemplary embodiment of an electronic device.

Referring to FIG. 2, the electronic device may be, for example, a smartphone 1100. A motherboard 1110 may be accommodated in the smartphone 1100, and various components 1120 may be physically and/or electrically connected to the motherboard 1110. Also, other components that may or may not be physically and/or electrically connected to the motherboard 1110, such as a camera module 1130 and/or a speaker 1140, may be accommodated in the smartphone 1100. Some of the electronic components 1120 may be the above-described chip-related components, e.g., a component package 1121, but are not limited thereto. The component package 1121 may be in the form of a printed circuit board on which electronic components including active components and/or passive components are surface-mounted, but is not limited thereto. Alternatively, the component package 1121 may be in the form of a printed circuit board in which active components and/or passive components are embedded. Meanwhile, the electronic device is not necessarily limited to the smartphone 1100, but may be any other electronic device as described above.

Printed Circuit Board

Figure 3:
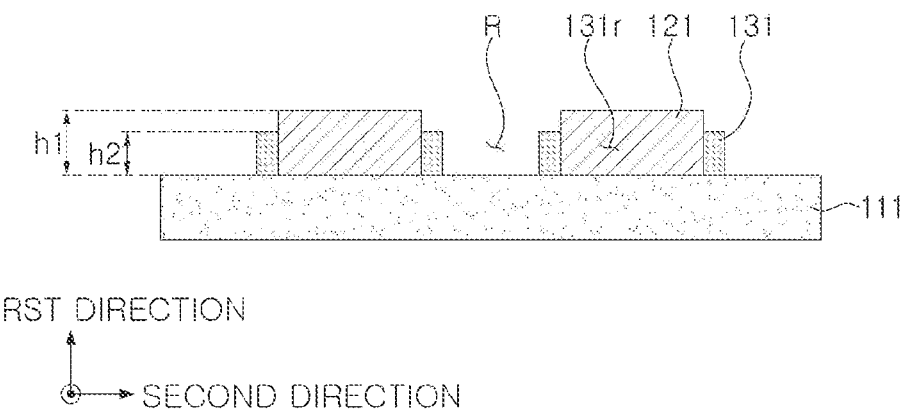
FIG. 3 is a cross-sectional view schematically illustrating an exemplary embodiment of a printed circuit board.

FIG. 3 is a cross-sectional view schematically illustrating an exemplary embodiment of a printed circuit board.

Figure 4:
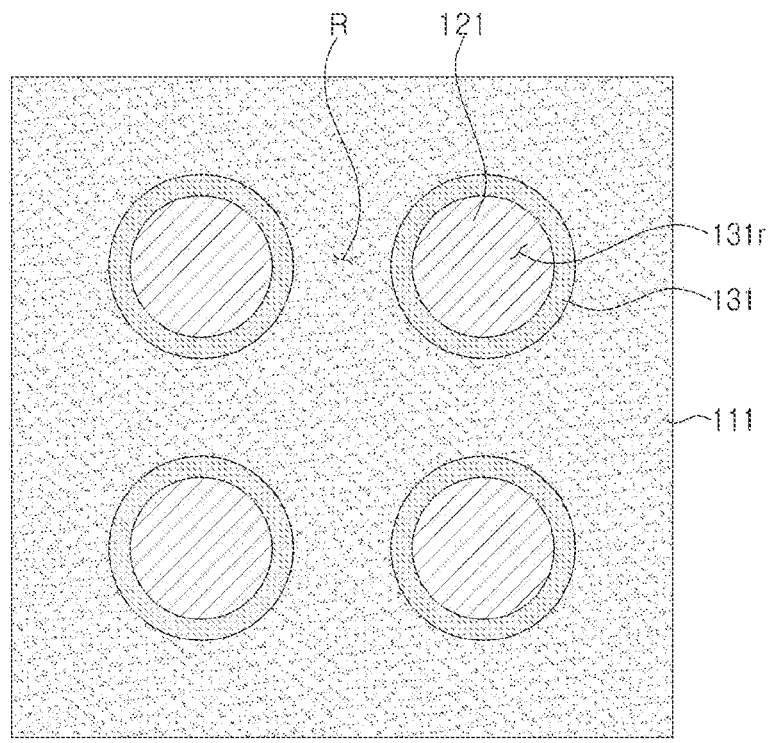
FIG. 4 is a schematic plan view of the printed circuit board of FIG. 3.

FIG. 4 is a schematic plan view of the printed circuit board of FIG. 3.

Referring to FIGS. 3 and 4, a printed circuit board 100A according to an exemplary embodiment may include: an insulating layer 111; a plurality of pads 121 disposed on the insulating layer 111; and a plurality of insulating walls 131 disposed on the insulating layer 111, and at least partially covering side surfaces of the plurality of pads 121, respectively. As a non-limiting example, the printed circuit board 100A according to an exemplary embodiment may be used as a package board for mounting a flip-chip die, and the plurality of pads 121 may be provided as bumps for mounting the die.

In the present disclosure, the "insulating wall" may be used as a term distinguished from the "insulating layer". For example, the insulating layer may simply refer to a layer having insulating properties regardless of its shape. On the other hand, the insulating wall may refer to an insulating layer having a shape to at least partially surround a side surface of a certain target component. That is, the insulating layer may have a more generic meaning than the insulating wall, and the insulating wall may be a subordinate concept of the insulating layer. From this point of view, the insulating wall may have a smaller area than the insulating layer, based on a sectional-view shape and/or based on a plan-view shape. In addition, a plurality of insulating walls may exist on the same level, and in this case, the insulating walls may exist independently of each other on the same level.

In the present disclosure, the sectional-view shape may refer to a sectional-view shape of an object when vertically cut in a first-second direction, a sectional-view shape of an object when vertically cut in a first-third direction, or a sectional-view shape of an object when viewed in a side view.

In the present disclosure, the plan-view shape may refer to a plan-view shape of an object when horizontally cut in a second-third direction, or a plan-view shape of an object when viewed in a top view or in a bottom view.

In the present disclosure, the first direction may refer to a stacking direction or a thickness direction, the second direction may refer to a width direction, and the third direction may refer to a length direction.

Meanwhile, as described above, high-performance semiconductor dies generally use flip-chip mounting technology for high-density mounting. At this point, in accordance with the miniaturization and high performance of semiconductors, there has also been a continuous decrease in distance between connection terminals for mounting a flip chip. Accordingly, there have been continuous increases in precision for sizes of solder resist openings in boards, level of difficulty in forming solder bumps, and level of difficulty concerning bridge shorts when dies are bonded to solders.

In this regard, in order to further decrease a pitch between bumps for connecting a board to a flip chip, a structure has been studied for easily applying an underfill, a non-conductive film (NCF), a non-conductive paste (NCP), or the like by forming a copper post on the board to secure a gap between the die and the board while using a small amount of solder.

Meanwhile, the board having such a copper post may be manufactured by forming a seed layer on a surface of the board, in which a solder resist is formed, using chemical copper plating, sputtering, or the like, performing a photolithography process including exposure, development, and stripping using a dry film, and then etching the seed layer.

In this case, however, it may be difficult to secure the adhesion of the seed layer formed on an upper side of the solder resist in the manufacturing process, and there may be restrictions on design rules for achieving a fine pitch between bumps, for example, the need for forming fine openings in the solder resist. In addition, it may be difficult to reduce a size of the solder resist and a diameter of the copper post due to an exposure registration tolerance of the copper post, and there may be a bridge short risk or the like when assembling a die with a fine pitch between bumps.

In contrast, the printed circuit board 100A according to an exemplary embodiment may have a structure in which the side surfaces of the plurality of pads 121 provided for mounting a die are approximately covered by the plurality of insulating walls 131, respectively, to reduce a bridge short risk or the like when assembling a flip-chip die and improve reliability. For example, the structure according to an exemplary embodiment may basically be a structure in which the side surfaces of the plurality of pads 121 provided as bumps for mounting a die are covered by the plurality of insulating walls 131, respectively, so that the die is connected to the printed circuit board using a small amount of solder with no solder attached to the die, thereby reducing a bridge short risk.

In addition, unlike a board having a copper post, the printed circuit board 100A according to an exemplary embodiment does not require a process of forming a seed layer on the solder resist. Also, it is possible to resolve the restrictions on design rules because a process of opening the resist for forming bump connectors maybe changed to a process of forming a recess. In addition, the plurality of pads 121 may be formed on a metal layer of a carrier substrate, and resultantly, it is possible to achieve highly superior height uniformity. In addition, a surface of the insulating layer 111, which undergoes an etching process, may have a roughened shape transferred from metal patterns subjected to roughening in an initial stage of manufacturing, resulting in high adhesion to a molding and/or an underfill when applied to a package structure later, as well as high reliability. In addition, the plurality of insulating walls 131 may also be subjected to roughening to secure stable adhesion.

Meanwhile, in the printed circuit board 100A according to an exemplary embodiment, the plurality of insulating walls 131 may at least partially cover the side surfaces of the plurality of pads 121, respectively, while being free from surfaces of the plurality of pads 121, respectively. Accordingly, when mounting a die, connection terminals of the die may be more stably placed, and may be bonded to connection members such as solders in a larger area, thereby improving adhesion and reliability.

In the present disclosure, when one component is mentioned as being free from another component, this may mean that the one component is not substantially present on the another component. For example, when the insulating wall 131 is mentioned as being free from the surface of the pad 121, this may mean that the insulating wall 131 is not substantially present on the surface of the pad 121. For example, the surface of the pad 121 may not be covered by the insulating wall 131, and may be physically separated from the insulating wall 131. Also, even in a case where an additional layer such as a surface treatment layer is formed on the surface of the pad 121, a surface of the additional layer may not be covered by the insulating wall 131, and may be physically separated from the insulating wall 131.

From this point of view, the insulating walls 131 may have cavities 131r in which the pads 121 are disposed, respectively, and the cavities 131r may entirely open the surfaces of the pads 121, respectively. Also, based on the sectional-view shape, each of the cavities 131r may have a substantially constant width.

In the present disclosure, the meaning of the term "substantially" may include a process error occurring in the manufacturing process, or a positional deviation, a measurement error, and the like. For example, the substantially constant width of the cavity of the insulating wall may mean that, since the side surface of the insulating wall has an approximately perpendicular shape based on the sectional-view shape, there is little deviation in width of the cavity, for example, difference in width between the uppermost side and the lowermost side of the cavity.

Meanwhile, in the printed circuit board 100A according to an exemplary embodiment, the pad 121 may have an approximately circular shape based on the plan-view shape. Also, the insulating wall 131 surrounding the pad 121 may have an approximately circular ring shape. However, the shapes of the pad 121 and the insulating wall 131 are not limited thereto, and may be other shapes, such as a square shape and an elliptical shape.

Meanwhile, in the printed circuit board 100A according to an exemplary embodiment, each of the plurality of insulating walls 131 may have a height h2 lower than a height h1 of each of the plurality of pads 121. This may be determined based on the first direction. The height difference (h1−h2) may be about 2 μm to 4 μm, but is not limited thereto. From this point of view, each of the plurality of insulating walls 131 may be thinner than each of the plurality of pads 121. In this case, when mounting a die, lower sides of the plurality of pads 121 may be protected by the plurality of insulating walls 131, respectively, to increase adhesion of the plurality of pads 121 to the insulating layer 111 and prevent damage to the plurality of pads 121.

Meanwhile, in the printed circuit board 100A according to an exemplary embodiment, each of the plurality of insulating walls 131 may have an interface with the insulating layer 111. For example, each of the plurality of insulating walls 131 may be a component distinguished from the insulating layer 111. From this point of view, each of the plurality of insulating walls 131 may include a different insulating material from the insulating layer 111. For example, each of the plurality of insulating walls 131 may include a solder resist. However, the insulating material of the plurality of insulating walls 131 is not limited thereto. As described above, the plurality of insulating walls 131 may be further formed using a process of forming a recess or the like, thereby more effectively resolving the restrictions on design rules.

Meanwhile, in the printed circuit board 100A according to an exemplary embodiment, the plurality of insulating walls 131 may be disposed to be spaced apart from each other on the insulating layer 111, thereby more effectively reducing a bridge short risk. Each of the plurality of insulating walls 131 may continuously surround the side surface of each of the plurality of pads 121, which may be preferable in reducing the bridge short risk, but is not limited thereto.

Meanwhile, in the printed circuit board 100A according to an exemplary embodiment, there may be recesses R between the plurality of insulating walls 131 and/or around the plurality of insulating walls 131. The recesses R may be connected to each other to form one recess R. The plurality of pads 121 may not be disposed in the recess R. The recess R may be positioned on substantially the same level as the plurality of pads 121. It may be determined based on the first direction whether the recess R and the plurality of pads 121 are positioned on substantially the same level. Through the recess R, the plurality of insulating walls 131 may have a ring shape to continuously surround the plurality of pads 121, respectively, independently from each other, which may be more preferable in reducing a bridge short risk.

Meanwhile, the printed circuit board 100A according to an exemplary embodiment may further include a surface treatment layer disposed on a surface of at least one of the plurality of pads 121. This makes it possible to mount a die more effectively. The surface treatment layer may be formed by, for example, electrolytic gold plating, electroless gold plating, organic solderability preservative (OSP), electroless tin plating, electroless silver plating, electroless nickel plating/substituted gold plating, direct immersion gold (DIG) plating, hot air solder leveling (HASL), or the like. From this point of view, the surface treatment layer may include at least one of a nickel (Ni) layer and a gold (Au) layer, but is not limited thereto. As a non-limiting example, the surface treatment layer may include a nickel (Ni) layer disposed on a surface of each of the pads 121 and a gold (Au) layer disposed on a surface of the nickel (Ni) layer, but is not limited thereto.

Hereinafter, components of the printed circuit board 100A according to an exemplary embodiment will be described in more detail with reference to the drawings.

The insulating layer 111 may include an insulating material. The insulating material may include a thermosetting resin such as an epoxy resin, a thermoplastic resin such as a polyimide resin, or a material including an inorganic filler, an organic filler, and/or a glass fiber together with the thermosetting or thermoplastic resin. For example, the insulating material may be an Ajinomoto build-up film (ABF), prepreg (PPG), resin coated copper (RCC), or the like, but is not limited thereto, and may be another type of polymer material.

Each of the plurality of pads 121 may include a metal material. The metal material may include copper (Cu), aluminum (Al), silver (Ag), tin (Sn), gold (Au), nickel (Ni), lead (Pb), titanium (Ti), and/or an alloy thereof. The plurality of pads 121 may perform various functions, depending on design, respectively. For example, the plurality of pads 121 may include ground pads, power pads, signal pads, and the like. Here, the signal pads may include pads for connecting various signals, e.g., data signals, except for the ground and power pads. Each of the plurality of pads 121 may include an electrolytic plating layer (or electrolytic copper), and may not include an electroless plating layer (chemical copper) if necessary.

Each of the plurality of insulating walls 131 may include an insulating material. The insulating material may include a photo imageable dielectric (PID), e.g., a photosensitive solder resist. However, the material is not particularly limited thereto, and may be another type of polymer material such as a thermosetting solder resist. The plurality of insulating walls 131 may be formed from the same single layer, and thus, may include the same insulating material.

In the present disclosure, the same insulating material refer to not only the completely same insulating material but also the same types of insulating materials. Therefore, the insulating materials may be slightly different in specific composition ratio while having substantially the same composition.

Figure 5:
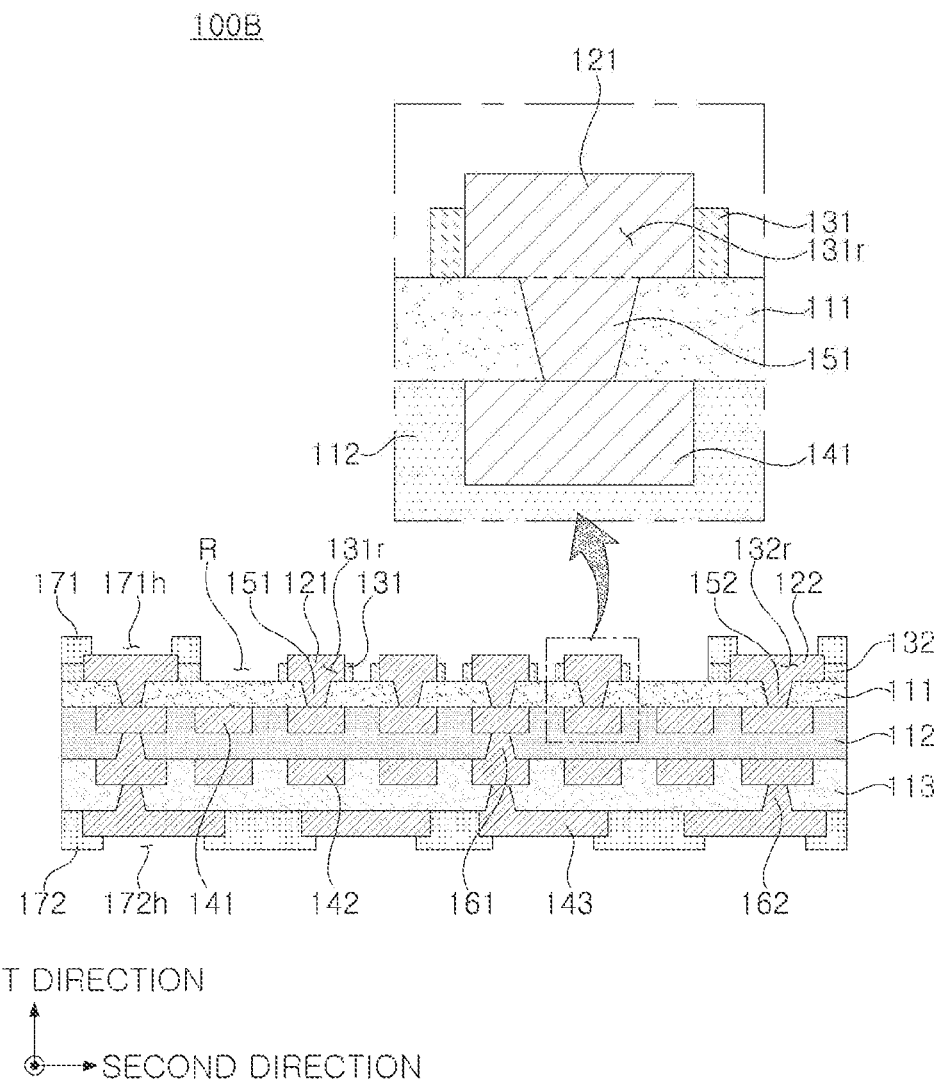
FIG. 5 is a cross-sectional view schematically illustrating another exemplary embodiment of a printed circuit board.

FIG. 5 is a cross-sectional view schematically illustrating another exemplary embodiment of a printed circuit board.

Referring to FIG. 5, a printed circuit board 100B according to another exemplary embodiment may include: a first insulating layer 111; a plurality of first pads 121 and a plurality of second pads 122 disposed on an upper surface of the first insulating layer 111; a plurality of first insulating walls 131 disposed on the upper surface of the first insulating layer 111 and at least partially covering side surfaces of the plurality of first pads 121, respectively; and a plurality of second insulating walls 132 disposed on the upper surface of the first insulating layer 111 and at least partially covering side surfaces of the plurality of second pads 122, respectively.

If necessary, the printed circuit board 100B according to another exemplary embodiment may further include: a first wiring layer 141 disposed on a lower surface of the first insulating layer 111; at least one first connection via 151 penetrating through the first insulating layer 111 to connect at least one of the plurality of first pads 121 to at least a portion of the first wiring layer 141; and/or at least one second connection via 152 penetrating through the first insulating layer 111 to connect at least one of the plurality of second pads 122 to at least another portion of the first wiring layer 141.

If necessary, the printed circuit board 100B according to another exemplary embodiment may further include: a second insulating layer 112 disposed on the lower surface of the first insulating layer 111 to at least partially embed the first wiring layer 141; a second wiring layer 142 disposed to protrude from a lower surface of the second insulating layer 112; and/or a first via layer 161 penetrating through the second insulating layer 112 to at least partially connect the first wiring layer 141 and the second wiring layer 142 to each other.

If necessary, the printed circuit board 100B according to another exemplary embodiment may further include: a third insulating layer 113 disposed on the lower surface of the second insulating layer 112 to at least partially embed the second wiring layer 142; a third wiring layer 143 disposed to protrude from a lower surface of the third insulating layer 113; and/or a second via layer 162 penetrating through the third insulating layer 113 to at least partially connect the second wiring layer 142 and the third wiring layer 143 to each other.

If necessary, the printed circuit board 100B according to another exemplary embodiment may further include: a first passivation layer 171 disposed on the plurality of second insulating walls 132 and having a first opening 171h for at least partially opening a surface of at least one of the plurality of second pads 122; and/or a second passivation layer 172 disposed on the lower surface of the third insulating layer 113 and having a second opening 172h for at least partially opening a surface of the third wiring layer 143.

Meanwhile, the printed circuit board 100B according to another exemplary embodiment may have a structure in which the side surfaces of the plurality of first pads 121 provided for mounting a die are approximately covered by the plurality of first insulating walls 131, respectively, to reduce a bridge short risk or the like when assembling a flip-chip die and improve reliability. For example, the structure according to another exemplary embodiment may basically be a structure in which the side surfaces of the plurality of first pads 121 provided as bumps for mounting a die are covered by the plurality of first insulating walls 131, respectively, so that solder or the like is not attached to the die, thereby reducing a bridge short risk. Similarly, it is possible to improve reliability or the like by forming a structure in which the side surfaces of the plurality of second pads 122 provided for assembling a package such as a board-on-board are approximately covered by the plurality of second insulating walls 132, respectively.

Meanwhile, as can be seen from the processes to be described below, unlike a board having a copper post, the printed circuit board 100B according to another exemplary embodiment does not require a process of forming a seed layer on the solder resist. Also, it is possible to resolve the restrictions on design rules because a process of opening the resist for forming bump connectors has been changed to a process of forming a recess. In addition, the plurality of first pads 121 and the plurality of second pads 122 may be formed on a metal layer of a carrier substrate, and resultantly, it is possible to achieve highly superior height uniformity. In addition, a surface of the first insulating layer 111, which undergoes an etching process, may have a roughened shape transferred from metal patterns subjected to roughening in an initial stage of manufacturing, resulting in high adhesion to a molding and/or an underfill when applied to a package structure later, as well as high reliability. In addition, the plurality of first insulating walls 131 and the plurality of second insulating walls 132 may also be subjected to roughening to secure stable adhesion.

Meanwhile, in the printed circuit board 100B according to another exemplary embodiment, the plurality of first insulating walls 131 may at least partially cover the side surfaces of the plurality of first pads 121, respectively, while being free from surfaces (e.g., upper surfaces according to the view in FIG. 5) of the plurality of first pads 121, respectively. Also, the plurality of second insulating walls 132 may at least partially cover the side surfaces of the plurality of second pads 122, respectively, while being free from surfaces (e.g., upper surfaces according to the view in FIG. 5) of the plurality of second pads 122, respectively. Accordingly, when mounting a die, connection terminals of the die may be more stably placed, and may be bonded to connection members such as solders in a larger area, thereby further improving adhesion and reliability.

From this point of view, the first insulating walls 131 and the second insulating walls 132 may have first cavities 131r, in which the respective first pads 121 are disposed, and second cavities 132r, in which the respective second pads 122 are disposed, respectively. Each of the first cavities 131r may entirely open a surface of each of the first pads 121, and each of the second cavities 132r may entirely open a surface of each of the second pads 122. In addition, based on the sectional-view shape, each of the first cavities 131r may have a substantially constant width. In addition, based on the sectional-view shape, each of the second cavities 132r may have a substantially constant width.

Meanwhile, in the printed circuit board 100B according to another exemplary embodiment, each of the plurality of first insulating walls 131 and the plurality of second insulating walls 132 may have an interface with the first insulating layer 111. For example, each of the plurality of first insulating walls 131 and the plurality of second insulating walls 132 may be a component distinguished from the insulating layer 111. From this point of view, each of the plurality of first insulating walls 131 and the plurality of second insulating walls 132 may include a different insulating material from the first insulating layer 111. For example, each of the plurality of first insulating walls 131 and the plurality of second insulating walls 132 may include a solder resist. However, the insulating material of the plurality of first insulating walls 131 and the plurality of second insulating walls 132 is not limited thereto. As described above, the plurality of first insulating walls 131 and the plurality of second insulating walls 132 may be further formed using a process of forming a recess or the like, thereby more effectively resolving the restrictions on design rules.

Meanwhile, in the printed circuit board 100B according to another exemplary embodiment, the plurality of first insulating walls 131 and the plurality of second insulating walls 132 may be disposed to be spaced apart from each other on the first insulating layer 111, thereby more effectively reducing a bridge short risk. Each of the plurality of first insulating walls 131 may continuously surround the side surface of each of the plurality of first pads 121, and each of the plurality of second insulating walls 132 may continuously surround the side surface of each of the plurality of second pads 122. The surrounding by the plurality of first and second insulating walls 131 and 132 in this manner may be preferable in reducing a bridge short risk, but the plurality of first and second insulating walls 131 and 132 are not limited thereto.

Meanwhile, in the printed circuit board 100B according to another exemplary embodiment, there may be recesses R between the plurality of first insulating walls 131 and/or between the plurality of first insulating walls 131 and the plurality of second insulating walls 132. The recesses R present therebetween may be connected to each other to form one recess R. The plurality of first pads 121 and/or the plurality of second pads 122 may not be disposed in the recesses R. Through the recess R, the plurality of first insulating walls 131 and the plurality of second insulating walls 132 may have a ring shape to continuously surround the plurality of first pads 121 and the plurality of second pads 122, respectively, independently from each other, which may be more preferable in reducing a bridge short risk.

Meanwhile, in the printed circuit board 100B according to another exemplary embodiment, the plurality of first pads 121 and the plurality of first insulating walls 131 surrounding the plurality of first pads 121, respectively, may be disposed on a center area of the first insulating layer 111, and the plurality of second pads 122 and the plurality of second insulating walls 132 surrounding the plurality of second pads 122, respectively, may be disposed in a side area on the first insulating layer 111. The plurality of first pads 121 may be used as bumps for mounting a die, and the plurality of second pads 122 may be used as bumps for connecting a board-on-board. From this point of view, each of the plurality of second pads 122 may be larger than each of the plurality of first pads 121. For example, based on the sectional-view shape, each of the plurality of second pads 122 may have a larger width than each of the plurality of first pads 121.

In the present disclosure, the center area may be an inside area where an electronic component, e.g., a flip-chip die, is disposed, and the side area may be an outside area where connection members for connecting a board-on-board or the like, such as solder ball joints, are disposed. Here, the inner side and the outer side may be determined based on the plan-view shape.

Meanwhile, in the printed circuit board 100B according to another exemplary embodiment, each of the plurality of first insulating walls 131 may have a lower height than each of the plurality of first pads 121, and the height difference may be about 2 μm to 4 μm, but is not limited thereto. Also, each of the plurality of second insulating walls 132 may have a lower height than each of the plurality of second pads 122, and the height difference may be about 2 μm to 4 μm, but is not limited thereto. This may be determined based on the first direction. From this point of view, each of the plurality of first insulating walls 131 may be thinner than each of the plurality of first pads 121. Also, each of the plurality of second insulating walls may be thinner than each of the plurality of second pads 122. In this case, when mounting a die and/or a wiring board, lower sides of the plurality of first pads 121 and/or the plurality of second pads 122 may be protected by the plurality of first insulating walls 131 and/or the plurality of second insulating walls 132, respectively, to increase adhesion of the plurality of first and second pads 121 and 122 to the insulating layer 111 and prevent damage to the plurality of first and second pads 121 and 122.

Meanwhile, in the printed circuit board 100B according to another exemplary embodiment, based on the sectional-view shape, each of the first connection via 151 and the second connection via 152 may have a tapered shape in which an upper surface thereof has a larger width than a lower surface thereof. For example, the first connection via 151 may have a larger width on a surface connected to the first pad 121 than on a surface connected to at least a portion of the first wiring layer 141. The second connection via 152 may have a larger width on a surface connected to the second pad 122 than on a surface connected to at least another portion of the first wiring layer 141. Accordingly, it is possible to further improve adhesion between the plurality of first pads 121 and/or the plurality of second pads and the at least one first connection via 151 and/or the at least one second connection via 152.

Meanwhile, in the printed circuit board 100B according to another exemplary embodiment, the first insulating layer 111 and the second insulating layer 112 may include different insulating materials. For example, the first insulating layer 111 may include a material capable of a semi additive process (SAP) for forming a microcircuit, e.g., an insulating material with no glass fiber. More specifically, the first insulating layer 111 may include an ABF, but is not limited thereto. On the other hand, the second insulating layer 112 may include a material having a high modulus to control bending, e.g., an insulating material with glass fibers. More specifically, the second insulating layer 112 may include an insulating material such as PPG or RCC, but is not limited thereto. From a similar point of view, the third insulating layer 113, which is an outermost layer on the opposite side, may include the same insulating material as the first insulating layer 111. In a case where the second insulating layer 112 is formed of a plurality of layers, all the layers may include the same insulating material, but are not limited thereto.

Meanwhile, the printed circuit board 100B according to another exemplary embodiment may further include a surface treatment layer disposed on a surface of at least one of the plurality of first pads 121 and/or the plurality of second pads 122. This makes it possible to mount a die more effectively. The surface treatment layer may be formed by, for example, electrolytic gold plating, electroless gold plating, OSP, electroless tin plating, electroless silver plating, electroless nickel plating/substituted gold plating, DIG plating, HASL, or the like. From this point of view, the surface treatment layer may include at least one of a nickel (Ni) layer and a gold (Au) layer, but is not limited thereto. As a non-limiting example, the surface treatment layer may include a nickel (Ni) layer disposed on a surface of each of the first pads 121 and/or the second pads 122 and a gold (Au) layer disposed on a surface of the nickel (Ni) layer, but is not limited thereto.

Hereinafter, components of the printed circuit board 100B according to another exemplary embodiment will be described in more detail with reference to the drawings.

Each of the first to third insulating layers 111 to 113 may include an insulating material. The insulating material may include a thermosetting resin such as an epoxy resin, a thermoplastic resin such as a polyimide resin, or a material including an inorganic filler, an organic filler, and/or a glass fiber together with the thermosetting or thermoplastic resin. For example, the insulating material may be an ABF, PPG, RCC, or the like, but is not limited thereto, and may be another type of polymer material. As a non-limiting example, each of the first insulating layer 111 and the third insulating layer 113 may include an ABF, and the second insulating layer 112 may include PPG, but the materials of the first to third insulating layers 111 to 113 are not limited thereto. The first insulating layer 111 and the third insulating layer 113 may be outermost insulating layers, and the second insulating layer 112 may be a build-up layer therebetween. The second insulating layer 112, which is a build-up layer, may be formed of a single layer as illustrated in FIG. 5, but may be formed of a plurality of layers unlike what is illustrated, and the specific number of layers is not particularly limited.

Each of the plurality of first and second pads 121 and 122 may include a metal material. The metal material may include copper (Cu), aluminum (Al), silver (Ag), tin (Sn), gold (Au), nickel (Ni), lead (Pb), titanium (Ti), and/or an alloy thereof. The plurality of first and second pads 121 and 122 may perform various functions, depending on design, respectively. For example, the plurality of first and second pads 121 and 122 may include ground pads, power pads, signal pads, and the like. Here, the signal pads may include pads for connecting various signals, e.g., data signals, except for the ground and power pads. Each of the plurality of first and second pads 121 and 122 may include an electrolytic plating layer (or electrolytic copper), and may not include an electroless plating layer (chemical copper) if necessary. For example, the number of metal layers for each of the first and second pads 121 and 122 may be smaller than that for each of the first to third wiring layers 141 to 143.

Each of the plurality of first and second insulating walls 131 and 132 may include an insulating material. The insulating material may include a photo imageable dielectric, e.g., a photosensitive solder resist. However, the material is not particularly limited thereto, and may be another type of polymer material such as a thermosetting solder resist. The plurality of first and second insulating walls 131 and 132 may be formed from the same single layer, and thus, may include the same insulating material.

Each of the first to third wiring layers 141 to 143 may include a metal material. The metal material may include copper (Cu), aluminum (Al), silver (Ag), tin (Sn), gold (Au), nickel (Ni), lead (Pb), titanium (Ti), and/or an alloy thereof. The first to third wiring layers 141 to 143 may perform various functions, depending on design, respectively. For example, the first to third wiring layers 141 to 143 may include ground patterns, power patterns, signal patterns, and the like. Here, the signal patterns may include pads for connecting various signals, e.g., data signals, except for the ground and power patterns. Each of these patterns may include a line pattern, a plane pattern, and/or a pad pattern. The second wiring layer 142 formed on the second insulating layer 112, which is a build-up layer, may be formed of a single layer as illustrated in FIG. 5, but may be formed of a plurality of layers unlike what is illustrated, and the specific number of layers is not particularly limited. Each of the first to third wiring layers 141 to 143 may include an electroless plating layer (or chemical copper) and an electrolytic plating layer (or electrolytic copper).

Each of the at least one first connection via 151 and the at least one second connection via 152 may include a metal material. The metal material may include copper (Cu), aluminum (Al), silver (Ag), tin (Sn), gold (Au), nickel (Ni), lead (Pb), titanium (Ti), and/or an alloy thereof. The at least one first connection via 151 and the at least one second connection via 152 may perform various functions, depending on design, respectively. For example, the at least one first connection via 151 and the at least one second connection via 152 may include connection vias for signal connection, connection vias for ground connection, connection vias for power connection, and the like. Each of the at least one first connection via 151 and the at least one second connection via 152 may be formed by completely filling a via hole with the metal material, or may be formed by placing the metal material along a wall of the via hole. The at least one first connection via 151 and the at least one second connection via 152 may have a stack via relationship or a staggered via relationship with connection vias in the first and second via layers 161 and 162, respectively. Each of the at least one first connection via 151 and the at least one second connection via 152 may include an electroless plating layer (or chemical copper) and an electrolytic plating layer (or electrolytic copper).

Each of the first and second via layers 161 and 162 may include a metal material. The metal material may include copper (Cu), aluminum (Al), silver (Ag), tin (Sn), gold (Au), nickel (Ni), lead (Pb), titanium (Ti), and/or an alloy thereof. The first and second via layers 161 and 162 may perform various functions, depending on design, respectively. For example, the first and second via layers 161 and 162 may include connection vias for signal connection, connection vias for ground connection, connection vias for power connection, and the like. Based on the sectional-view shape, the first and second via layers 161 and 162 may be tapered in the same direction. In addition, based on the sectional-view shape, the first and second via layers 161 and 162 may be tapered in the opposite direction to the at least one first connection via 151 and the at least one second connection via 152. For example, based on the sectional-view shape, each of the connection vias in the first and second via layers 161 and 162 may have a tapered shape in which an upper surface thereof has a smaller width than a lower surface thereof. Each of the connection vias in the first and second via layers 161 and 162 may be completely filled with the metal material, or may be formed by placing the metal material along a wall of a via hole. The connection vias in the first and second via layers 161 and 162 may have a stack via relationship or a staggered via relationship with each other. The second via layer 162 formed in the second insulating layer 112, which is a build-up layer, may be formed of a single layer as illustrated in FIG. 5, but may be formed of a plurality of layers unlike what is illustrated, and the specific number of layers is not particularly limited. Each of the first and second via layers 161 and 162 may include an electroless plating layer (or chemical copper) and an electrolytic plating layer (or electrolytic copper). The second via layer 162 may be formed through the same plating process as the third wiring layer 143, and thus, the second via layer 162 and the third wiring layer 143 may be integrated with each other without a boundary line therebetween.

The first and second passivation layers 171 and 172 may include a solder resist, but are not limited thereto. Each of the first and second passivation layers 171 and 172 may include, for example, an ABF including a thermosetting resin and an inorganic filler. The first and second passivation layers 171 and 172 may be disposed on the outermost sides of the printed circuit board 100B, respectively, to protect patterns, etc. therebetween from the outside. The first and second passivation layers 171 and 172 may have one or more first and second openings 171h and 172h, respectively. For example, the first passivation layer 171 may have one or more first openings 171h for at least partially opening surfaces of one or more of the plurality of second pads 122. In one example, the first passivation layer 171 may be spaced apart from the plurality of first pads 121. In addition, the second passivation layer 172 may have one or more second openings 172h for at least partially opening a surface of the third wiring layer 143. Surface treatment layers, each including a nickel (Ni) layer and/or a gold (Au) layer, may be formed on surfaces exposed through the first and second openings 171h and 172h.

The other details, for example, the details described above for the printed circuit board 100A, may be applicable to the printed circuit board 100B according to another exemplary embodiment unless contradictory, and the overlapping description will be omitted.

FIGS. 6A to 6J are views schematically illustrating an exemplary embodiment of a method for manufacturing the printed circuit board of FIG. 5.

Figure 6A:
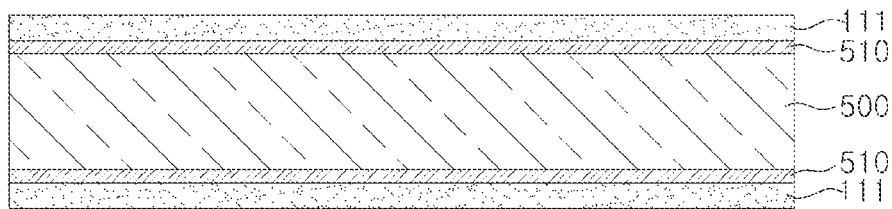
FIGS. 6A to 6J are views schematically illustrating an exemplary embodiment of a method for manufacturing the printed circuit board of FIG. 5.

Referring to FIG. 6A, a carrier substrate 500 formed with a metal layer 510 on one or both surfaces thereof may be prepared, and a first insulating layer 111 may be formed on the metal layer 510 of the carrier substrate 500. The carrier substrate 500 may be a copper clad laminate (CCL) or the like, but is not limited thereto, and any other carrier substrate may be used, not particularly limited, as long as it is used as a detachable carrier. The metal layer 510 may include a copper (Cu) layer such as a copper foil, but is not limited thereto, and may further include another metal layer. A release layer for easy detachment may be disposed between the metal layer 510 and the carrier substrate 500. The first insulating layer 111 may be formed by laminating and then curing an uncured layer including the above-described insulating material. Alternatively, the first insulating layer 111 may be formed by applying and then curing the above-described insulating material.

Figure 6B:
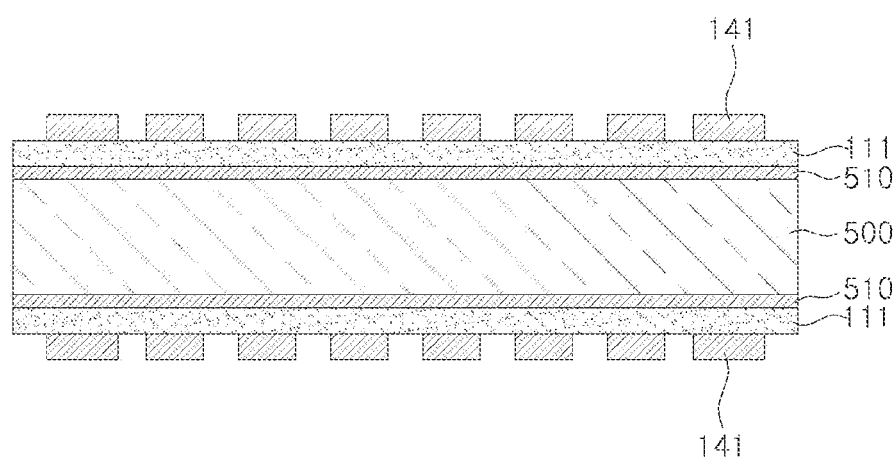

Referring to FIG. 6B, a first wiring layer 141 may be formed on one surface of the first insulating layer 111. The first wiring layer 141 may be formed by a plating process such as an additive process (AP), a semi AP (SAP), a modified SAP (MSAP), or tenting (TT).

Figure 6C:
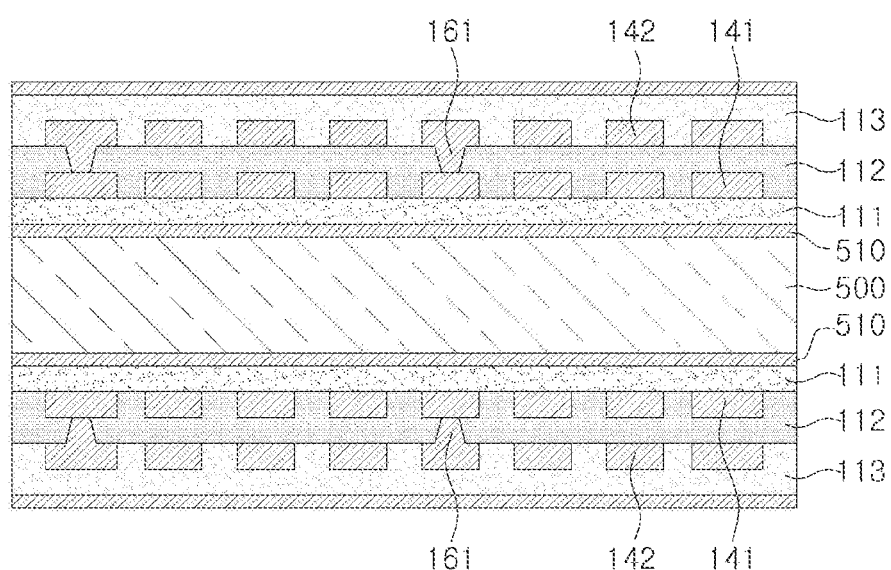

Referring to FIG. 6C, a second insulating layer 112 at least partially embedding the first wiring layer 141 may be formed on one surface of the first insulating layer 111. The second insulating layer 112 may be formed by laminating and then curing an uncured layer including the above-described insulating material. Alternatively, the second insulating layer 112 may be formed by applying and then curing the above-described insulating material. Thereafter, via holes may be formed in the second insulating layer 112 by laser drilling or the like, and a second wiring layer 142 and a first via layer 161 may be formed on and in the second insulating layer 112 by performing a plating process such as AP, SAP, MSAP, or TT. Thereafter, a third insulating layer 113 at least partially embedding the second wiring layer 142 may be formed on the second insulating layer 112. The third insulating layer 113 may be formed by laminating and then curing an uncured layer including the above-described insulating material. Alternatively, the third insulating layer 113 may be formed by applying and then curing the above-described insulating material.

Figure 6D:
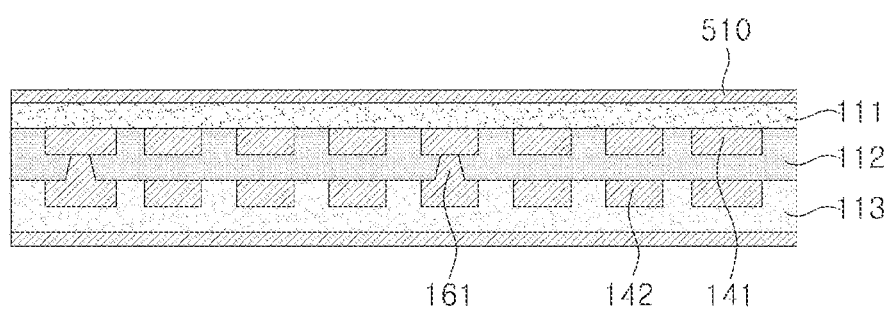

Referring to FIG. 6D, the carrier substrate 500 may be removed. For example, the carrier substrate 500 and the metal layer 510 may be separated from each other. A release layer may be used to separate the carrier substrate 500 and the metal layer 510 from each other, but the separation method is not limited thereto.

Figure 6E:
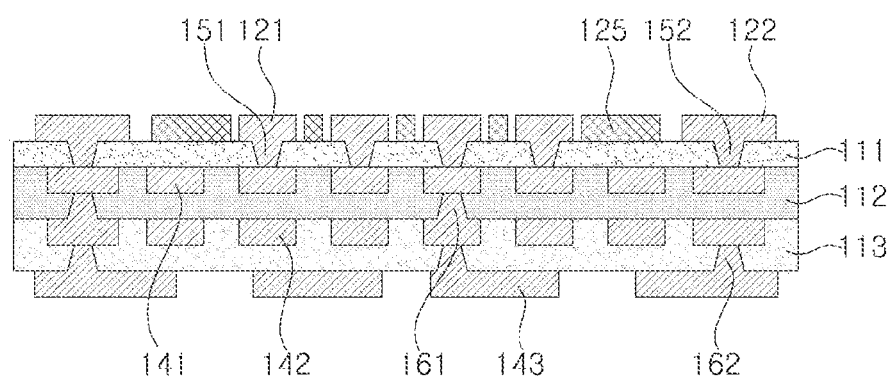

Referring to FIG. 6E, a plurality of first and second pads 121 and 122 and a plurality of conductor patterns 125 may be formed on the other surface of the first insulating layer 111. Also, at least one first connection via 151 and at least one second connection via 152 may be formed in the first insulating layer 111. The plurality of first and second pads 121 and 122 and the plurality of conductor pattern 125, and the at least one first connection via 151 and the at least one second connection via 152 may be formed by forming via holes in the first insulating layer 111 by laser drilling or the like and then performing a plating process such as AP, SAP, MSAP, or TT. Also, a third wiring layer 143 may be formed on the third insulating layer 113. In addition, a second via layer 162 may formed in the third insulating layer 113. The third wiring layer 143 and the second via layer 162 may be formed by forming via holes in the third insulating layer 113 by laser drilling or the like and then performing a plating process such as AP, SAP, MSAP, or TT.

Figure 6F:
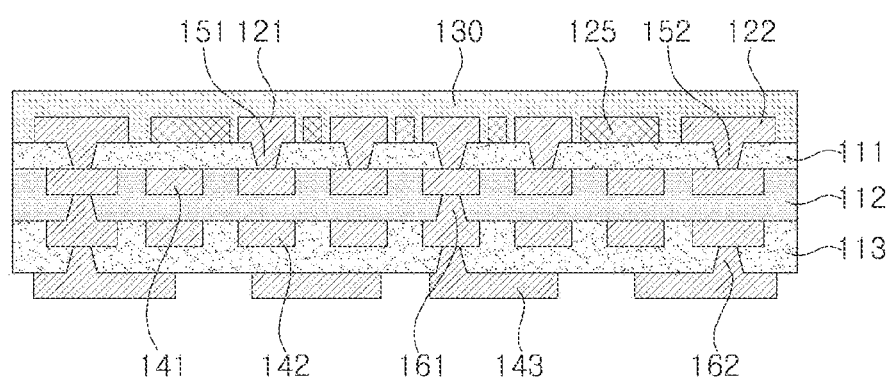

Referring to FIG. 6F, a solder resist layer 130 may be formed on the other surface of the first insulating layer 111.

The solder resist layer 130 may be formed by laminating and then curing an uncured layer including a solder resist. Alternatively, the solder resist layer 130 may be formed by applying and then curing a material including a solder resist. However, the solder resist layer 130 is not necessarily formed, but another type of polymer layer may be formed.

Figure 6G:
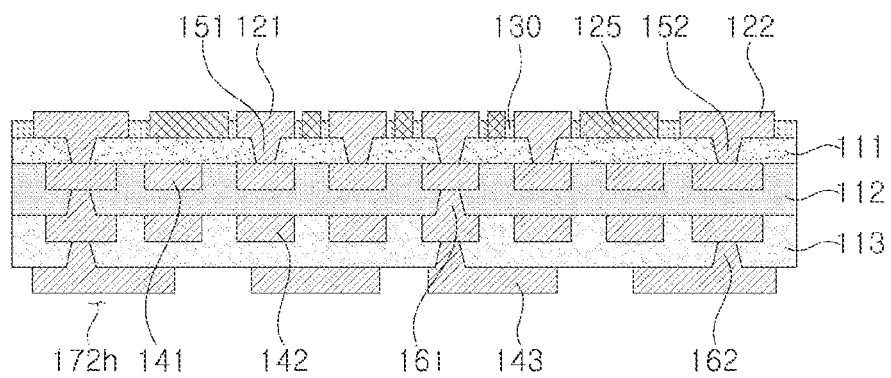

Referring to FIG. 6G, a thinning process may be performed to lower a height of the solder resist layer 130, that is, to reduce a thickness of the solder resist layer 130. This may be determined based on the first direction. For the thinning process, chemical etching, dry etching, or the like may be used. Through this process, the solder resist layer 130 may be thinner than the plurality of first and second pads 121 and 122 and conductor patterns 125. Also, a plurality of first and second insulating walls 131 and 132 formed through the solder resist layer 130 may have a uniform thickness. The plurality of first and second insulating walls 131 and 132 may have substantially the same height.

Figure 6H:
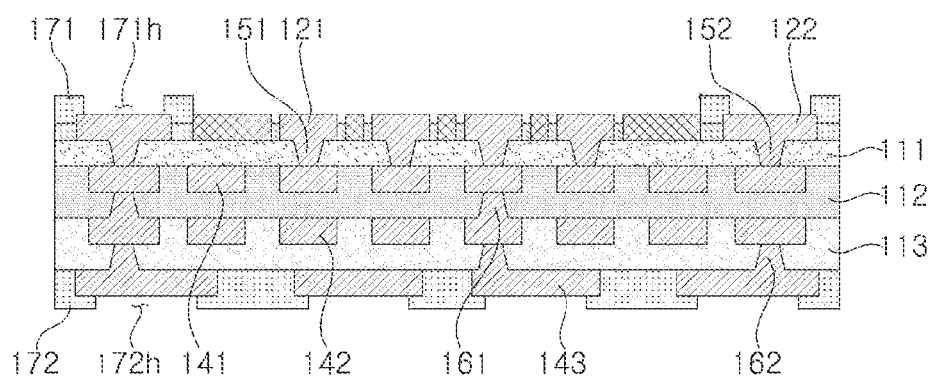

Referring to FIG. 6H, first and second passivation layers 171 and 172 may be formed. The first and second passivation layers 171 and 172 may be patterned to form first and second openings 171h and 172h. The first and second passivation layers 171 and 172 may be formed by, for example, patterning to have first and second openings 171h and 172h, respectively, using a photolithography process or the like, after forming the solder resist layer, but are not limited thereto.

Figure 6I:
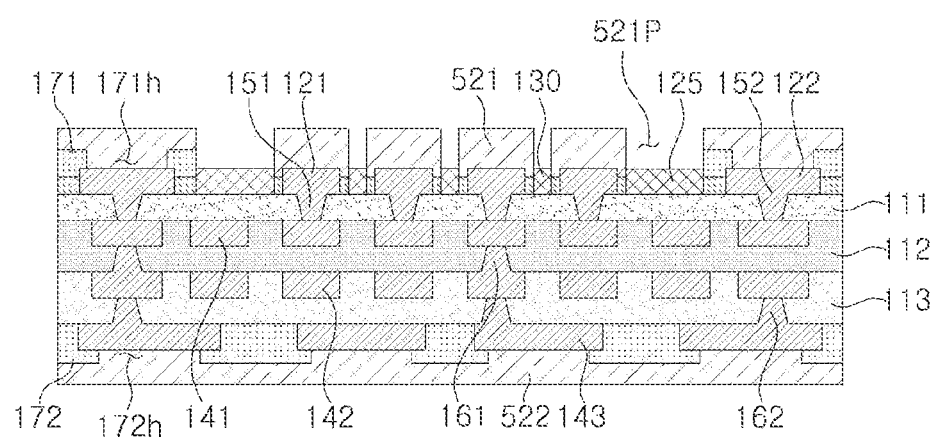

Referring to FIG. 6I, a first dry film 521 may be disposed on the first insulating layer 111 and the first passivation layer 171. In addition, a second dry film 522 may be disposed on the second passivation layer 172. Thereafter, the first dry film 521 may be patterned by a photolithography process including exposure, development, etc. to form exposed portions 521p exposing the conductor patterns 125.

Figure 6J:
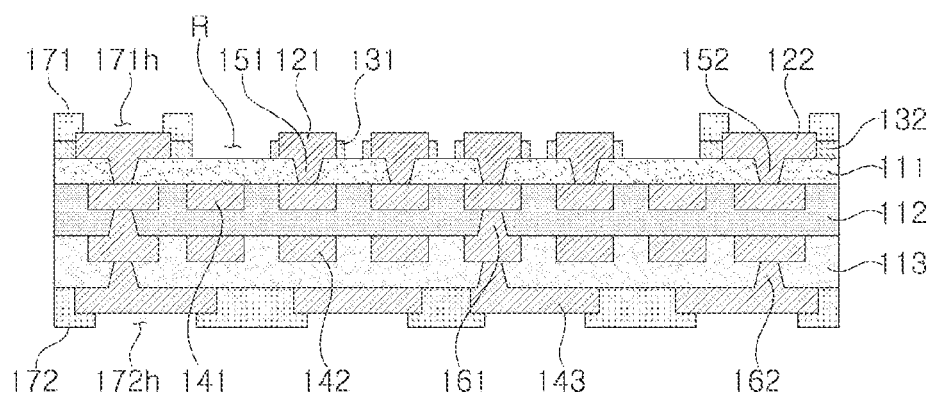

Referring to FIG. 6J, the conductor patterns 125 may be removed. For example, the conductor patterns 125 selectively exposed through the exposed portions 521p may be removed by an etching process. By removing the conductor patterns 125, a recess R may be formed in the solder resist layer 130. A plurality of first and second insulating walls 131 and 132 at least partially covering side surfaces of the plurality of first and second pads 121 and 122, respectively may be formed by the recess R. Thereafter, the first and second dry films 521 and 522 may be removed. For example, a known an stripper may be used.

If necessary, surface treatment layers may further be formed on the plurality of first and second pads 121 and 122. The surface treatment layer may be formed by, for example, electrolytic gold plating, electroless gold plating, OSP, electroless tin plating, electroless silver plating, electroless nickel plating/substituted gold plating, DIG plating, HASL, or the like, but is not limited thereto. The surface treatment layer may include at least one of a nickel (Ni) layer and a gold (Au) layer, but is not limited thereto.

Through a series of processes, the printed circuit board 100B according to another exemplary embodiment described above may be manufactured. However, this is merely an example of a manufacturing method, and the printed circuit board 100B according to another exemplary embodiment described above may be manufactured through other processes.

The other details, for example, the details described above for the printed circuit boards 100A and 100B, may be applicable to the method for manufacturing the printed circuit board 100B unless contradictory, and the overlapping description will be omitted.

Figure 7:
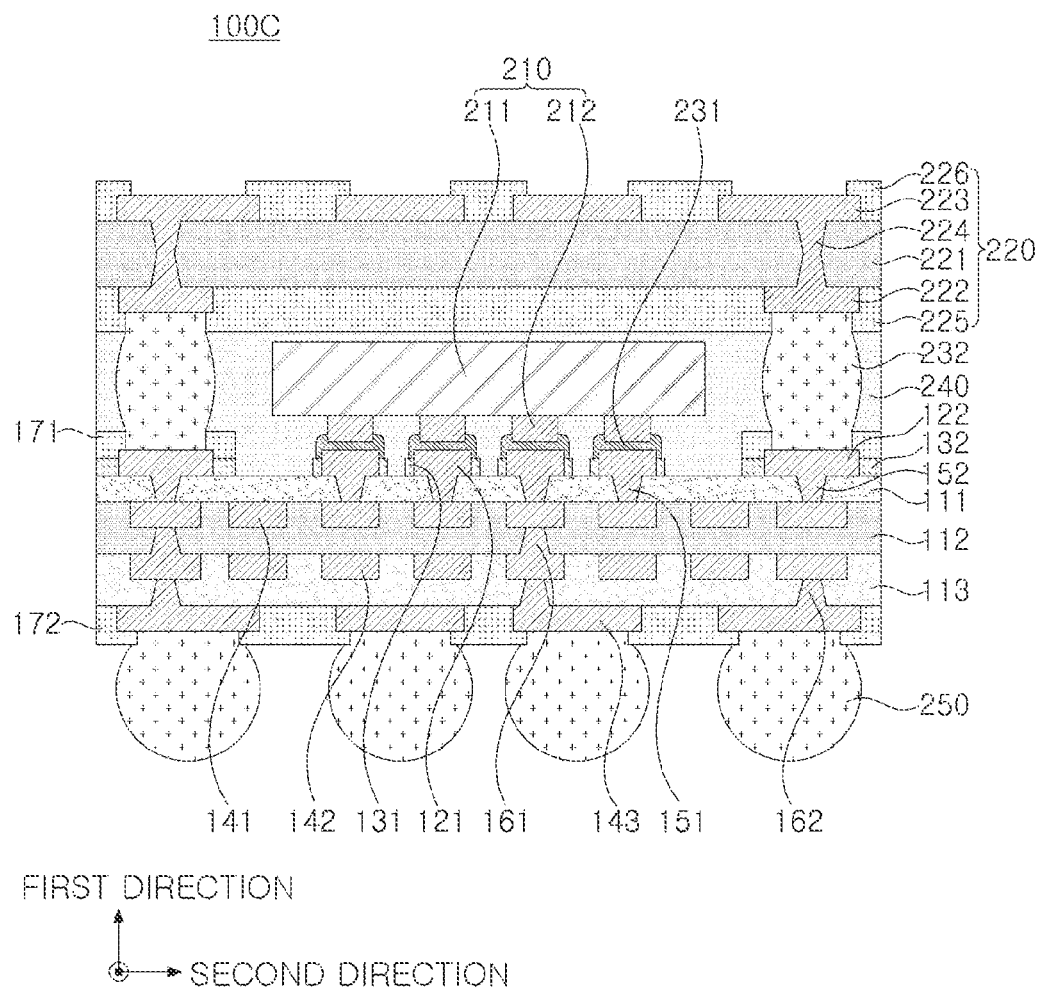
FIG. 7 is a cross-sectional view schematically illustrating a modified exemplary embodiment of the printed circuit board of FIG. 5.

FIG. 7 is a cross-sectional view schematically illustrating a modified exemplary embodiment of the printed circuit board of FIG. 5.

Referring to FIG. 7, a printed circuit board 100C according to a modified exemplary embodiment may have a package structure in which an electronic component 210 is surface-mounted on the above-described printed circuit board 100B, and then a separate wiring board 220 is disposed thereon in a board-on-board type. For example, when compared to the above-described printed circuit board 100B, the printed circuit board 100C according to a modified exemplary embodiment may further include: an electronic component 210 disposed above the first insulating layer 111 and including a plurality of connection terminals 212 electrically connected to the first pads 121 through first connection members 231, respectively; and a wiring board 220 disposed on the electronic component 210 and including a plurality of connection pads 222 electrically connected to the second pads 122 through second connection members 232, respectively. Also, the printed circuit board 100C according to a modified exemplary embodiment may further include a molding material 240 for molding between the first insulating layer 111 and the wiring board 220, and/or electrical connection metals 250 connected to the third wiring layer 143. Here, the above-described printed circuit board 100B may be used as a package board for mounting a flip-chip die or the like.

The electronic component 210 may be any type of active and/or passive component. For example, the electronic component 210 may include any type of integrated circuit (IC) die 211, e.g., a flip-chip die. Alternatively, the electronic component 210 may include a chip-type passive component such as a chip capacitor, e.g., a multilayer ceramic capacitor (MLCC), or a chip inductor, e.g., a power inductor (PI). Alternatively, the electronic component 210 may include a silicon capacitor. As described above, the type of electronic component 210 is not particularly limited. The electronic component 210 may include connection terminals 212 including a metal material such as copper (Cu) or aluminum (Al). The electronic component 210 may be surface-mounted in a face-down form through the connection terminals 212. The electronic component 210 may have a front surface on which the connection terminals 212 are disposed and a back surface on which the connection terminals 212 are not disposed.

The wiring board 220 may be an interposer board for connection with another package or a package board on which another semiconductor die or the like is directly mounted. The wiring board 220 may include an insulating layer 221, connection pads 222 and 223 disposed on both sides of the insulating layer 221; through vias 224 penetrating through the insulating layer 221 and electrically connecting the connection pads 222 and 223 to each other, and passivation layers 225 and 226 disposed on both sides of the insulating layer 221 to at least partially cover the connection pads 222 and 223. However, this is merely an example, and further insulating layers, wiring layers, and via layers constituting the wiring board 220 may be arranged in various forms.

The insulating layer 221 may include an insulating material. The insulating material may include a thermosetting resin such as an epoxy resin, a thermoplastic resin such as a polyimide resin, or a material including an inorganic filler, an organic filler, and/or a glass fiber together with the thermosetting or thermoplastic resin. For example, the insulating material may be an ABF, PPG, RCC, or the like, but is not limited thereto, and may be another type of polymer material.

The connection pads 222 and 223 may include a metal material. The metal material may include copper (Cu), aluminum (Al), silver (Ag), tin (Sn), gold (Au), nickel (Ni), lead (Pb), titanium (Ti), and/or an alloy thereof. The connection pads 222 and 223 may perform various functions, depending on design, respectively. For example, the connection pads 222 and 223 may include ground pads, power pads, signal pads, and the like. Here, the signal pads may include pads for connecting various signals, e.g., data signals, except for the ground and power pads. The number of connection pads 222 and 223 is not particularly limited, and a plurality of connection pads 222 and a plurality of connection pads 223 may be arranged.

The through vias 224 may include a metal material. The metal material may include copper (Cu), aluminum (Al), silver (Ag), tin (Sn), gold (Au), nickel (Ni), lead (Pb), titanium (Ti), and/or an alloy thereof. The through vias 224 may perform various functions, depending on design, respectively. For example, the through vias 224 may include through vias for signal connection, through vias for ground connection, through vias for power connection, and the like. The through vias 224 may have any shape, such as an hourglass shape or a cylindrical shape.

The passivation layers 225 and 226 may include known solder resist layers, but are not limited thereto. Each of the passivation layers 225 and 226 may include, for example, an ABF including a thermosetting resin and an inorganic filler. Each of the passivation layers 225 and 226 may have one or more openings. Surface treatment layers, each including a nickel (Ni) layer and/or a gold (Au) layer, may be formed on surfaces of the connection pads 222 and 223 exposed through the openings.

The first and second connection members 231 and 232 may include a low melting point metal having a lower melting point than copper (Cu), e.g., tin (Sn) or an alloy including tin (Sn). For example, the first and second connection members 231 and 232 may include solders. For example, the first and second connection members 231 and 232 may be in the form of solder ball joints. The number of first and second connection members 231 and 232, distances between the first and second connection members 231 and 232, how to array the first and second connection members 231 and 232, and the like are not particularly limited.

The molding material 240 may mold and protect the electronic component 210, the first and second connection members 231 and 232, etc. The molding material 240 may include an epoxy resin or the like, but the material is not particularly limited thereto, and may include another known material.

The electrical connection metals 250 may physically and/or electrically connect the printed circuit board 100C to the outside. For example, the printed circuit board 100C may be a ball grid array (BGA)-type package board. The electrical connection metals 250 may include a low melting point metal having a lower melting point than copper (Cu), e.g., tin (Sn) or an alloy including tin (Sn). For example, the electrical connection metals 250 may include solders. However, this is merely an example, and the material is not particularly limited thereto. The electrical connection metals 250 may be lands, balls, pins, or the like. The electrical connection metal 250 may be multi-layered or single-layered. When formed of multiple layers, the electrical connection metal 250 may include a copper pillar and a solder. When formed of a single layer, the electrical connection metal 250 may include a tin-silver solder. However, this is also merely an example, and the material is not particularly limited thereto. The number of electrical connection metals 250, a distance between the electrical connection metals 250, how to array the electrical connection metals 250, and the like are not particularly limited, and may be adequately modified depending on design.

The other details, for example, the details described above for the printed circuit boards 100A and 100B, may be applicable to the printed circuit board 100C according to a modified exemplary embodiment unless contradictory, and the overlapping description will be omitted.

Figure 8:
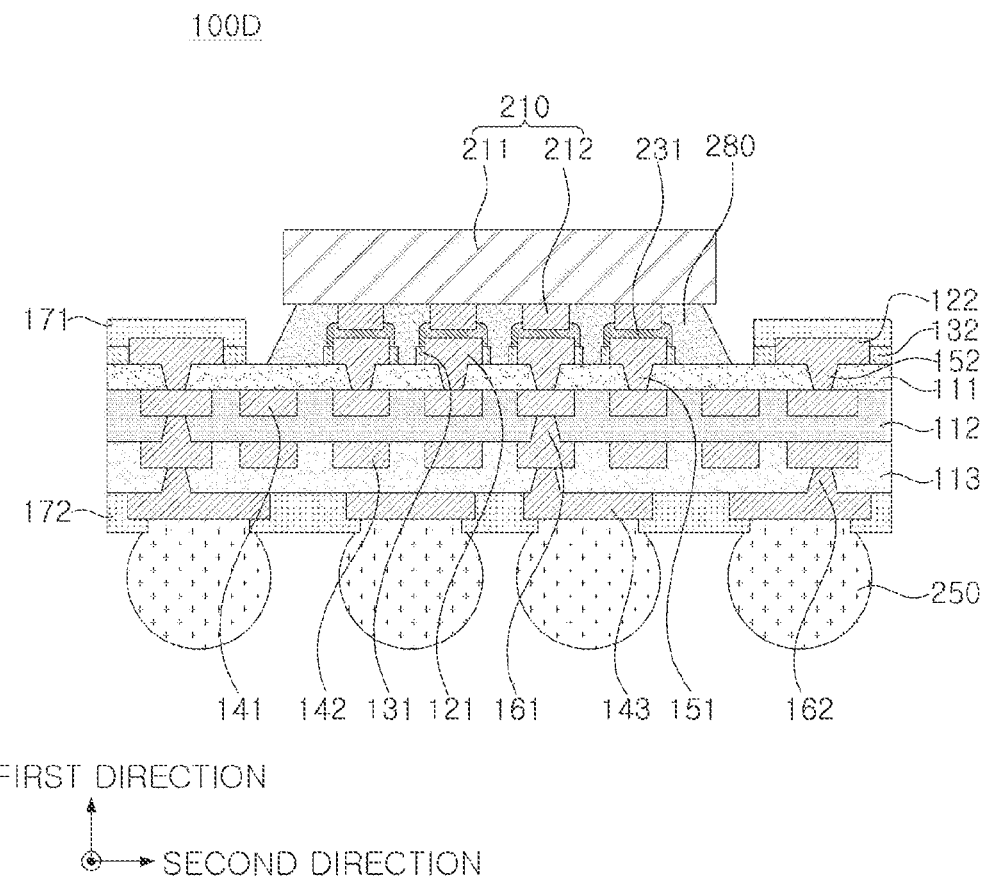
FIG. 8 is a cross-sectional view schematically illustrating another modified exemplary embodiment of the printed circuit board of FIG. 5.

FIG. 8 is a cross-sectional view schematically illustrating another modified exemplary embodiment of the printed circuit board of FIG. 5.

Referring to FIG. 8, a printed circuit board 100D according to another modified exemplary embodiment may have a package structure in which an electronic component 210 is surface-mounted on the above-described printed circuit board 100B. For example, when compared to the above-described printed circuit board 100B, the printed circuit board 100D according to another modified exemplary embodiment may further include an electronic component 210 disposed above the first insulating layer 111 and including a plurality of connection terminals 212 electrically connected to the first pads 121 through first connection members 231, respectively. In addition, the printed circuit board 100D according to another modified exemplary embodiment may further include an underfill 280 filling a space between the first insulating layer 111 and the electronic component 210 and/or electrical connection metals 250 connected to the third wiring layer 143. In addition, the first passivation layer 171 may not have the above-described first opening 171h. Here, the above-described printed circuit board 100B may be used as a package board for mounting only a flip-chip die or the like without involving a board-on-board.

The underfill 280 may fix the electronic component 210 onto the first insulating layer 111. The underfill 280 may embed and protect the connection terminals 212, the first connection members 231, and the first insulating walls 131, etc. The underfill 280 may include an adhesive component such as an epoxy resin, but the material is not limited thereto, and may include another known material.

The other details, for example, the details described above for the printed circuit boards 100A, 100B, and 100C, may be applicable to the printed circuit board 100D according to another modified exemplary embodiment unless contradictory, and the overlapping description will be omitted.

Figure 9:
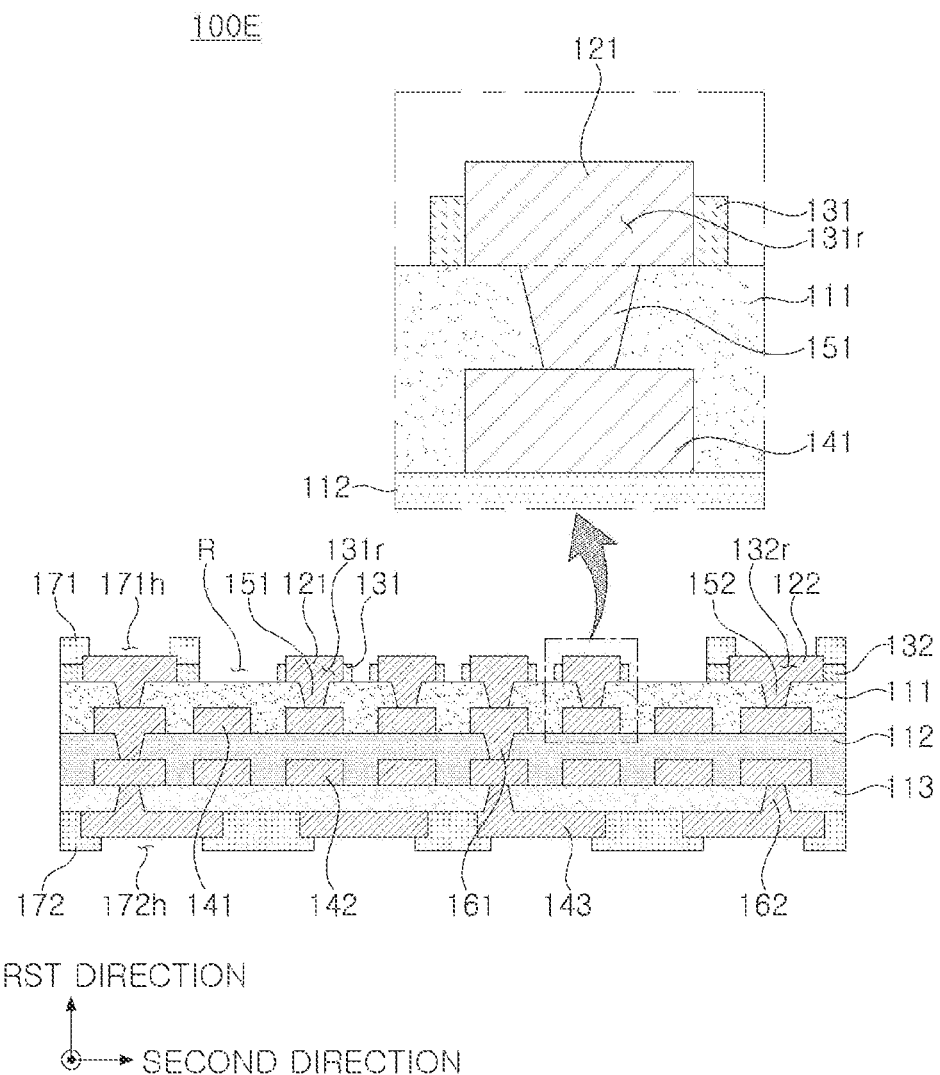
FIG. 9 is a cross-sectional view schematically illustrating another exemplary embodiment of a printed circuit board.

FIG. 9 is a cross-sectional view schematically illustrating another exemplary embodiment of a printed circuit board.

Referring to FIG. 9, when compared to the printed circuit board 100B according to another exemplary embodiment, a printed circuit board 100E according to another exemplary embodiment is different in the arrayment and the shape of the first to third wiring layers 141 to 143 and the first and second via layers 161 and 162. For example, the first wiring layer 141 may be at least partially embedded in the first insulating layer 111, and a lower surface of the first wiring layer 141 may be at least partially exposed from the lower surface of the first insulating layer 111. Also, the second wiring layer 142 may be at least partially embedded in the second insulating layer 112, and a lower surface of the second wiring layer 142 may be at least partially exposed from the lower surface of the second insulating layer 112. In addition, the first and second via layers 161 and 162 may be tapered in opposite directions. For example, the first via layer 161 may be tapered in the same direction as the first and second connection vias 151 and 152, and the second via layer 162 may be tapered in an opposite direction to the first and second connection vias 151 and 152.

The other details, for example, the details described above for the printed circuit boards 100A, 100B, 100C, and 100D, may be applicable to the printed circuit board 100E according to another exemplary embodiment unless contradictory, and the overlapping description will be omitted.

FIGS. 10A to 10J are views schematically illustrating an exemplary embodiment of a method for manufacturing the printed circuit board of FIG. 9.

Figure 10A:
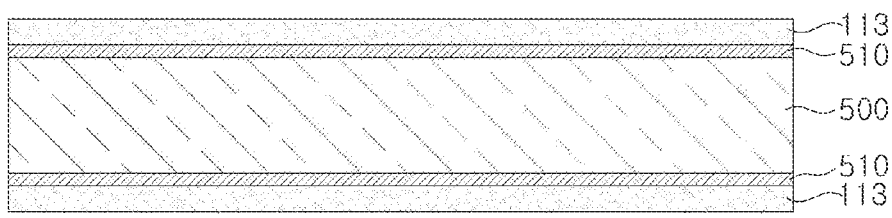
FIGS. 10A to 10J are views schematically illustrating an exemplary embodiment of a method for manufacturing the printed circuit board of FIG. 9.

Referring to FIG. 10A, a carrier substrate 500 formed with a metal layer 510 on one or both surfaces thereof may be prepared, and a third insulating layer 113 may be formed on the metal layer 510.

Figure 10B:
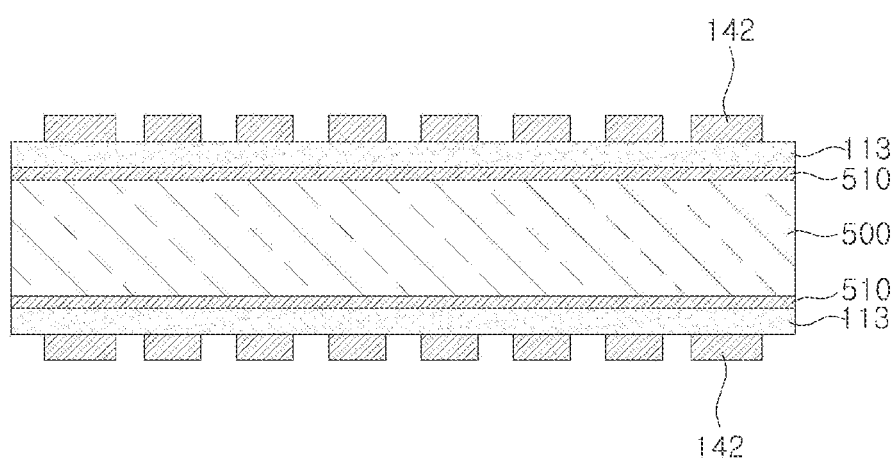

Referring to FIG. 10B, a second wiring layer 142 may be formed on one surface of the third insulating layer 113.

Figure 10C:
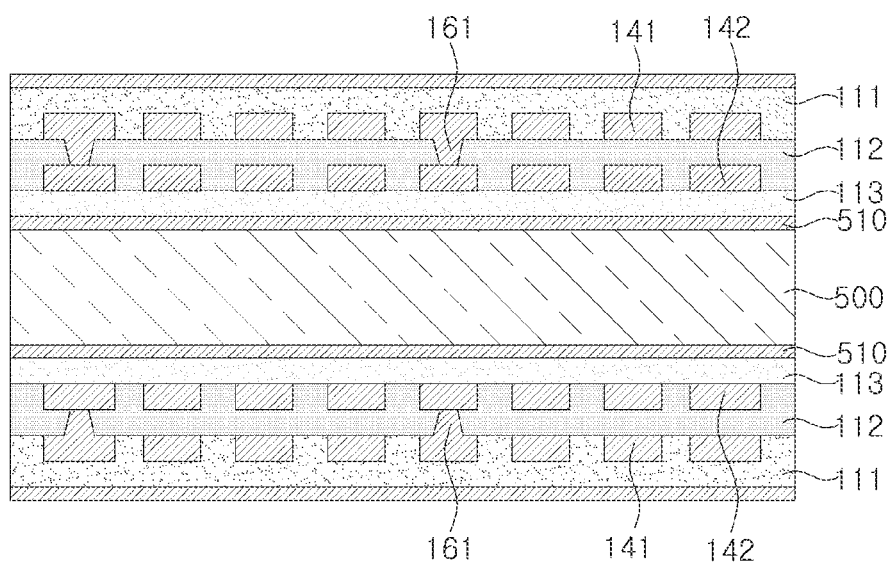

Referring to FIG. 10C, a second insulating layer 112 at least partially embedding the second wiring layer 142 may be formed on one surface of the third insulating layer 113. Thereafter, a first wiring layer 141 may be formed on the second insulating layer 112, and a first via layer 161 penetrating through the second insulating layer 112 may be formed. Thereafter, a first insulating layer 111 at least partially embedding the first wiring layer 141 may be formed on the second insulating layer 112.

Figure 10D:
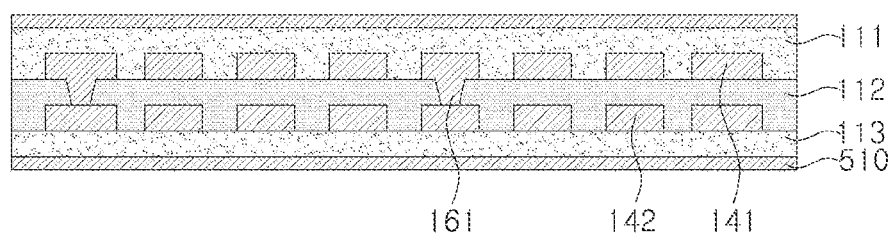

Referring to FIG. 10D, the carrier substrate 500 may be removed. For example, the carrier substrate 500 and the metal layer 510 may be separated from each other.

Figure 10E:
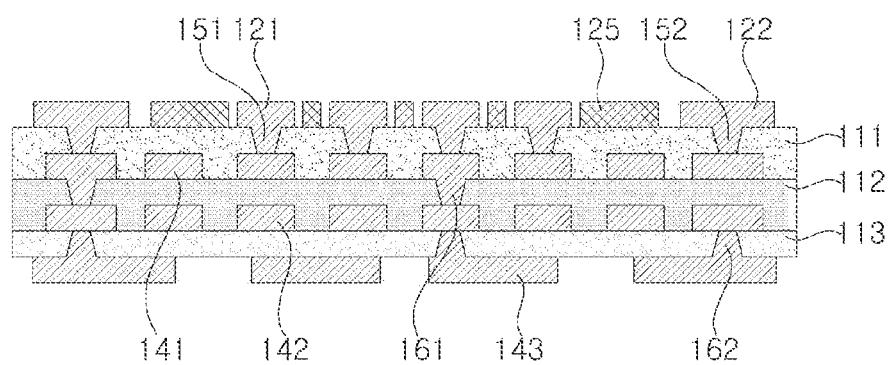

Referring to FIG. 10E, a plurality of first and second pads 121 and 122 and a plurality of conductor patterns 125 may be formed on the first insulating layer 111. Also, at least one first connection via 151 and at least one second connection via 152 may be formed in the first insulating layer 111. In addition, a third wiring layer 143 may be formed on the other surface of the third insulating layer 113. Also, a second via layer 162 penetrating through the third insulating layer 113 may be formed.

Figure 10F:
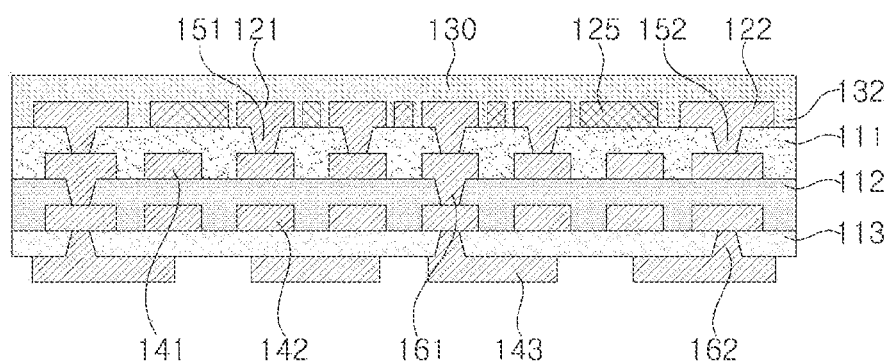

Referring to FIG. 10F, a solder resist layer 130 may be formed on the first insulating layer 111.

Figure 10G:
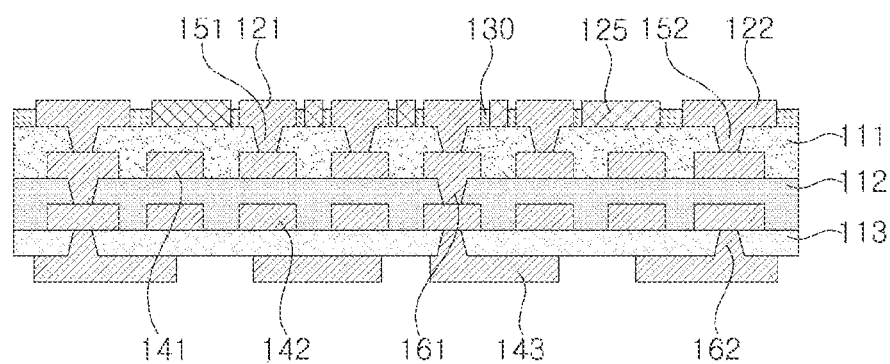

Referring to FIG. 10G, a thinning process may be performed to lower a height of the solder resist layer 130, that is, to reduce a thickness of the solder resist layer 130.

Figure 10H:
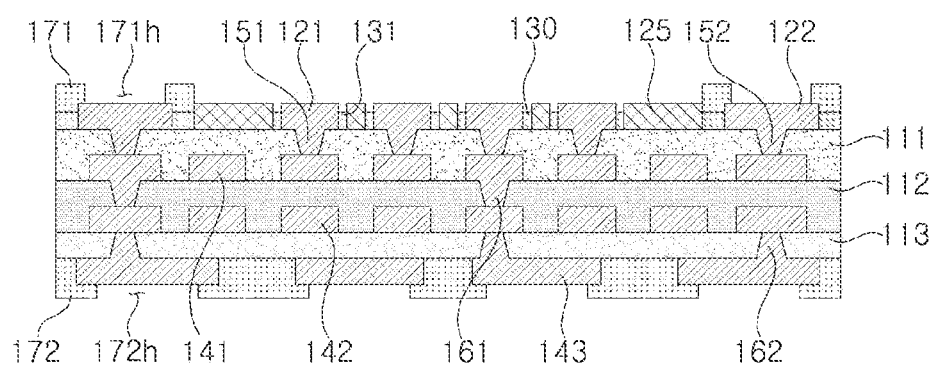

Referring to FIG. 10H, first and second passivation layers 171 and 172 may be formed. Also, first and second openings 171h and 172h may be formed.

Figure 10I:
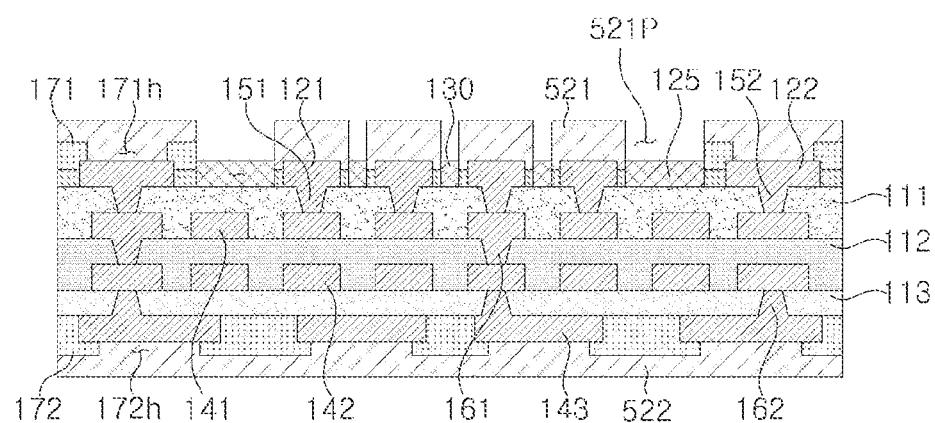

Referring to FIG. 10I, a first dry film 521 may be disposed on the first insulating layer 111 and the first passivation layer 171. In addition, a second dry film 522 may be disposed on the second passivation layer 172. Thereafter, the first dry film 521 may be patterned to form exposed portions 521p exposing the conductor patterns 125.

Figure 10J:
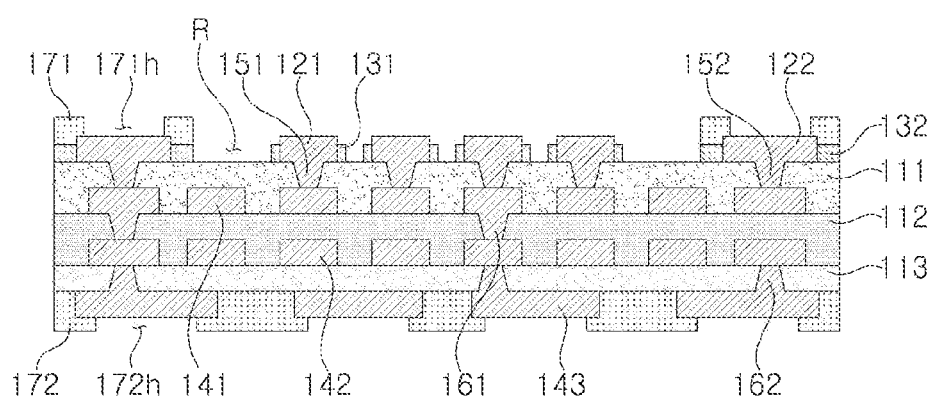

Referring to FIG. 10J, the conductor patterns 125 may be removed. By removing the conductor patterns 125, a recess R may be formed in the solder resist layer 130. A plurality of first and second insulating walls 131 and 132 at least partially covering side surfaces of the plurality of first and second pads 121 and 122, respectively, may be formed by the recess R. Thereafter, the first and second dry films 521 and 522 may be removed.

Through a series of processes, the printed circuit board 100E according to another exemplary embodiment described above may be manufactured. However, this is merely an example of a manufacturing method, and the printed circuit board 100E according to another exemplary embodiment described above may be manufactured through other processes.

The other details, for example, the details described above for the printed circuit boards 100A, 100B, 100C, 100D, and 100E and the details described above for the manufacturing method, may be applicable to the method for manufacturing the printed circuit board 100E unless contradictory, and the overlapping description will be omitted.

Figure 11:
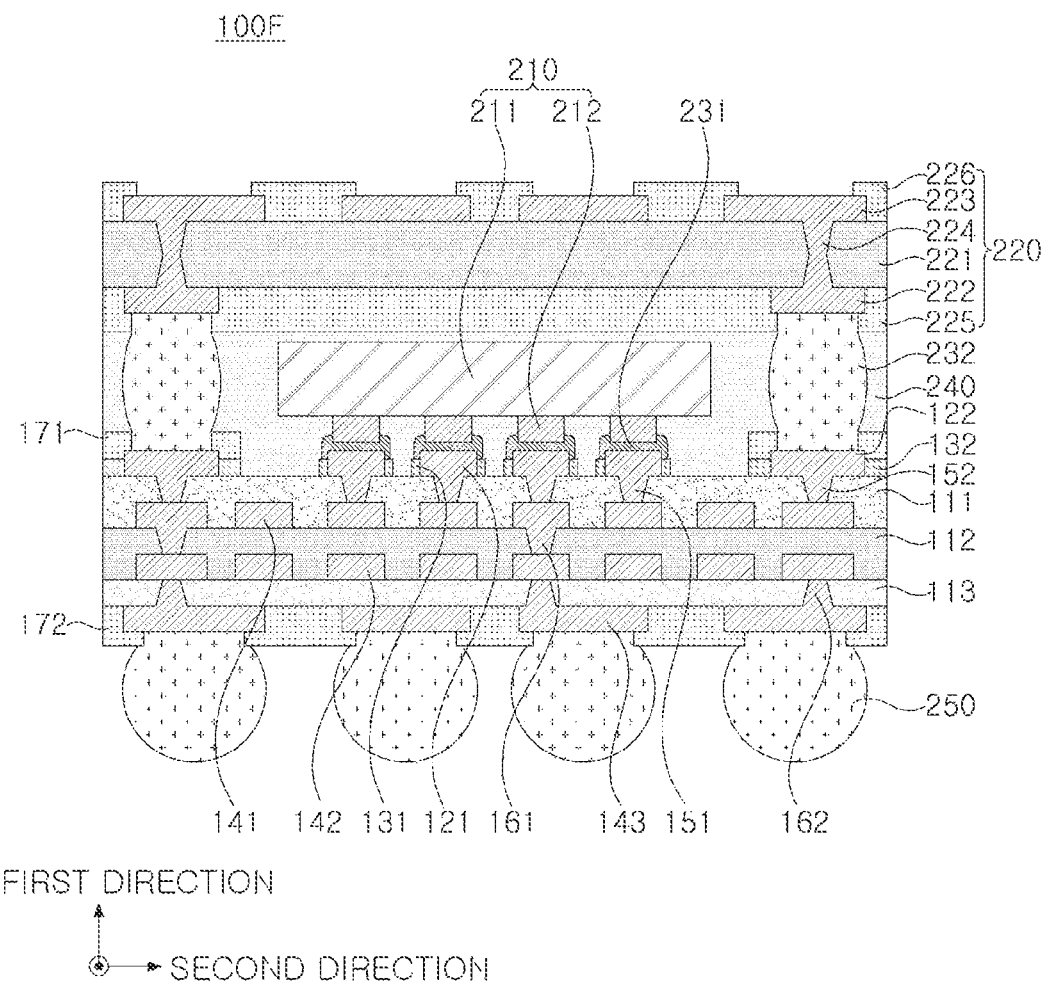
FIG. 11 is a cross-sectional view schematically illustrating a modified exemplary embodiment of the printed circuit board of FIG. 9.

FIG. 11 is a cross-sectional view schematically illustrating a modified exemplary embodiment of the printed circuit board of FIG. 9.

Referring to FIG. 11, a printed circuit board 100F according to a modified exemplary embodiment may have a package structure in which an electronic component 210 is surface-mounted on the above-described printed circuit board 100E, and then a separate wiring board 220 is disposed thereon in a board-on-board type. Here, the above-described printed circuit board 100E may be used as a package board for mounting a flip-chip die or the like.

The other details, for example, the details described above for the printed circuit boards 100A, 100B, 100C, 100D, and 100E, may be applicable to the printed circuit board 100F according to a modified exemplary embodiment unless contradictory, and the overlapping description will be omitted.

Figure 12:
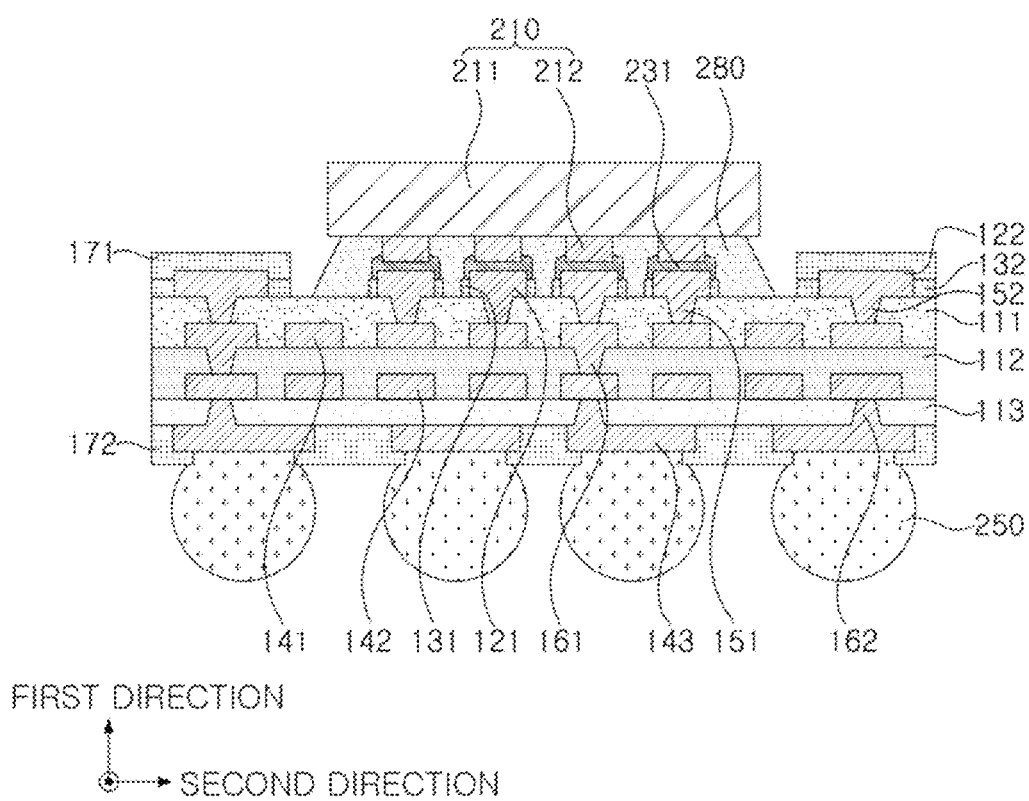
FIG. 12 is a cross-sectional view schematically illustrating another modified exemplary embodiment of the printed circuit board of FIG. 9.

FIG. 12 is a cross-sectional view schematically illustrating another modified exemplary embodiment of the printed circuit board of FIG. 9.

Referring to FIG. 12, a printed circuit board 100G according to another modified exemplary embodiment may have a package structure in which an electronic component 210 is surface-mounted on the above-described printed circuit board 100E. Here, the above-described printed circuit board 100E may be used as a package board for mounting only a flip-chip die or the like without involving a board-on-board.

The other details, for example, the details described above for the printed circuit boards 100A, 100B, 100C, 100D, 100E, and 100F, may be applicable to the printed circuit board 100G according to another modified exemplary embodiment unless contradictory, and the overlapping description will be omitted.

Figure 13:
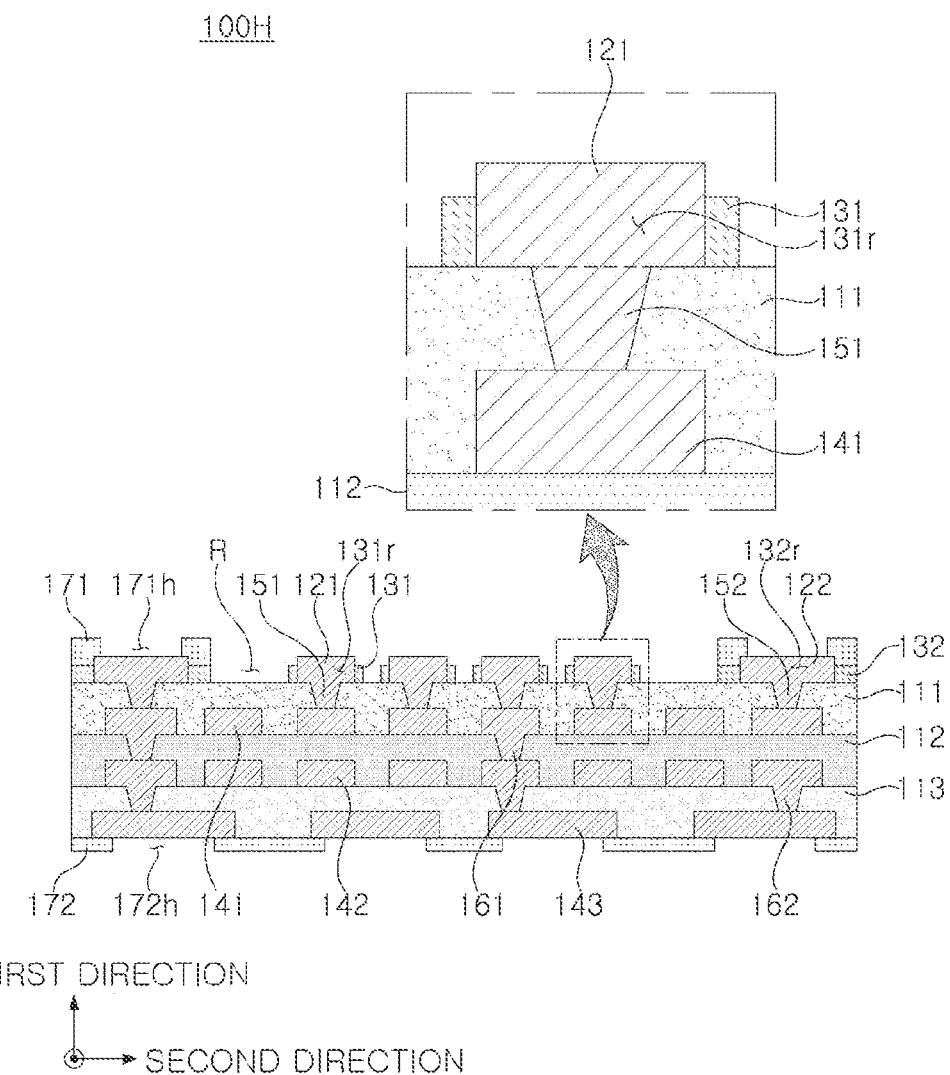
FIG. 13 is a cross-sectional view schematically illustrating another exemplary embodiment of a printed circuit board.

FIG. 13 is a cross-sectional view schematically illustrating another exemplary embodiment of a printed circuit board.

Referring to FIG. 13, when compared to the printed circuit board 100B according to another exemplary embodiment, a printed circuit board 100H according to another exemplary embodiment is different in the arraymeent and the shape of the first to third wiring layers 141 to 143 and the first and second via layers 161 and 162. For example, the first wiring layer 141 may be at least partially embedded in the first insulating layer 111, and a lower surface of the first wiring layer 141 may be at least partially exposed from the lower surface of the first insulating layer 111. Also, the second wiring layer 142 may be at least partially embedded in the second insulating layer 112, and a lower surface of the second wiring layer 142 may be at least partially exposed from the lower surface of the second insulating layer 112. Also, the third wiring layer 143 may be at least partially embedded in the third insulating layer 113, and a lower surface of the third wiring layer 143 may be at least partially exposed from the lower surface of the third insulating layer 113. In addition, the first and second via layers 161 and 162 may be tapered in the same direction. For example, the first and second via layers 161 and 162 may be tapered in the same direction as the first and second connection vias 151 and 152.

The other details, for example, the details described above for the printed circuit boards 100A, 100B, 100C, 100D, 100E, 100F, and 100G, may be applicable to the printed circuit board 100H according to another exemplary embodiment unless contradictory, and the overlapping description will be omitted.

FIGS. 14A to 14J are views schematically illustrating an exemplary embodiment of a method for manufacturing the printed circuit board of FIG. 13.

Figure 14A:
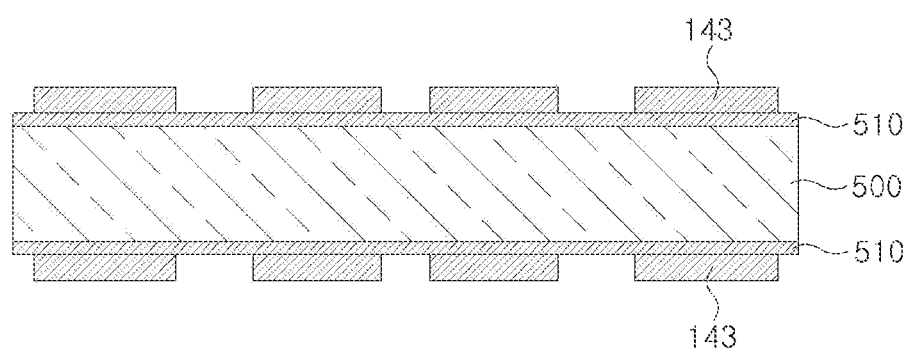
FIGS. 14A to 14J are views schematically illustrating an exemplary embodiment of a method for manufacturing the printed circuit board of FIG. 13.

Referring to FIG. 14A, a carrier substrate 500 formed with a metal layer 510 on one or both surfaces thereof may be prepared, and a third wiring layer 143 may be formed on the metal layer 510.

Figure 14B:
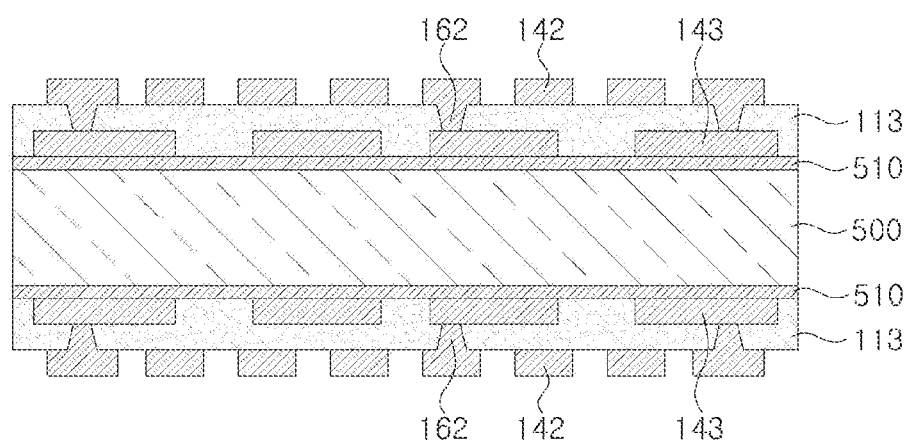

Referring to FIG. 14B, a third insulating layer 113 at least partially embedding the third wiring layer 143 may be formed on the metal layer 510. Thereafter, a second wiring layer 142 may be formed on the third insulating layer 113, and a second via layer 162 penetrating through the third insulating layer 113 may be formed.

Figure 14C:
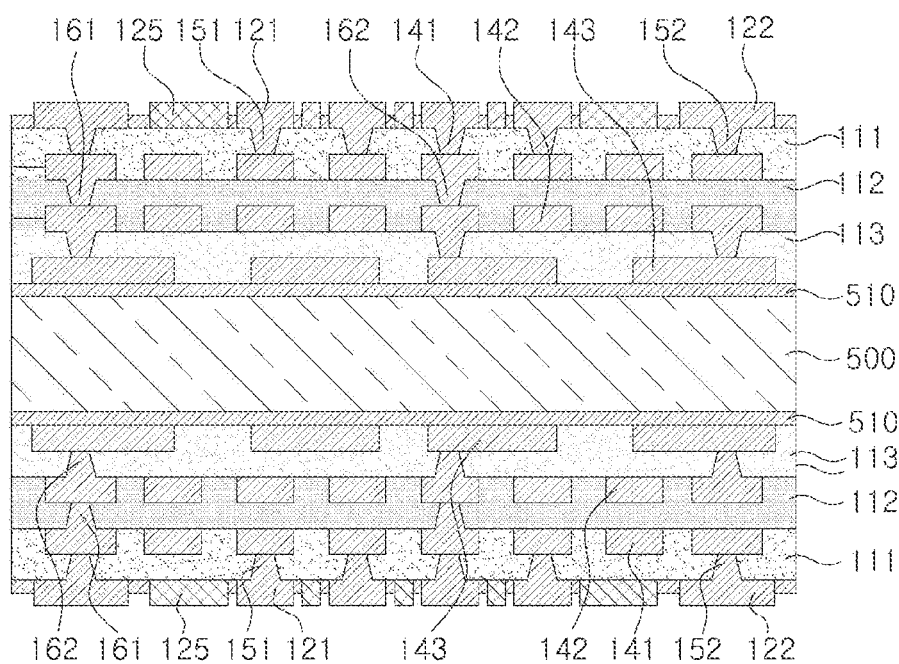

Referring to FIG. 14C, a second insulating layer 112 at least partially embedding the second wiring layer 142 may be formed on the third insulating layer 113. Thereafter, a first wiring layer 141 may be formed on the second insulating layer 112, and a first via layer 161 penetrating through the second insulating layer 112 may be formed. Thereafter, a first insulating layer 111 at least partially embedding the first wiring layer 141 may be formed on the second insulating layer 112. Thereafter, a plurality of first and second pads 121 and 122 and a plurality of conductor patterns 125 may be formed on the first insulating layer 111, and at least one first connection via 151 and at least one second connection via 152 penetrating through the first insulating layer 111 may be formed.

Figure 14D:
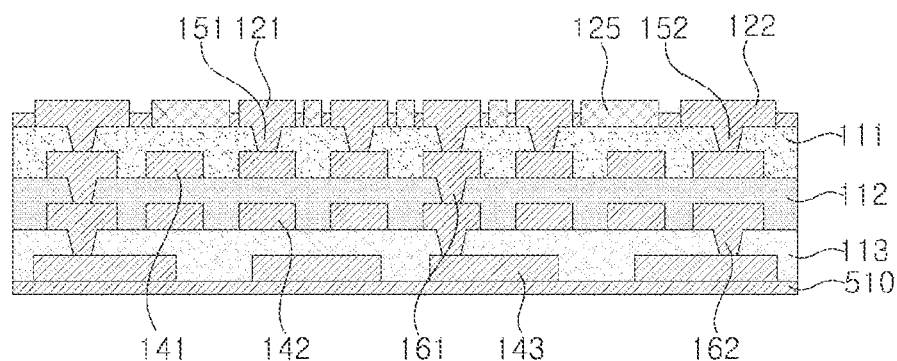

Referring to FIG. 14D, the carrier substrate 500 may be removed. For example, the carrier substrate 500 and the metal layer 510 may be separated from each other.

Figure 14E:
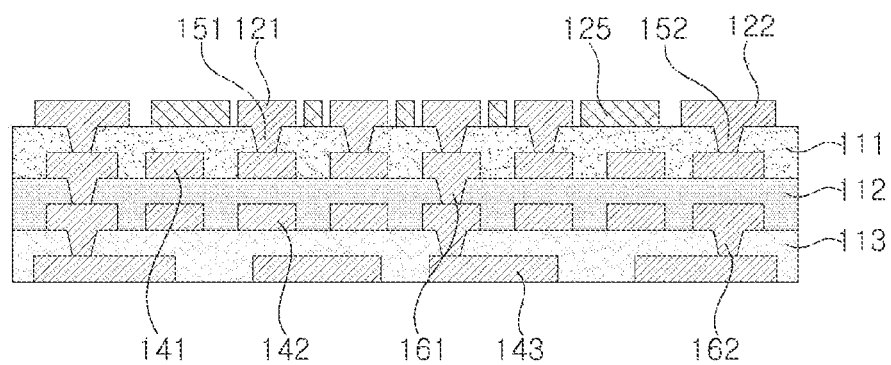

Referring to FIG. 14E, the metal layer 510 may be removed. The metal layer 510 may be removed by an etching process. In this case, a seed layer disposed on the first insulating layer 111 may also be removed. Meanwhile, when the metal layer 510 is removed, a surface of the third wiring layer 143 may also be partially removed, and a step may occur. However, the step may be prevented, if the metal layer 510 includes a barrier layer having an etching property different from that of copper (Cu), such as nickel (Ni) or titanium (Ti).

Figure 14F:
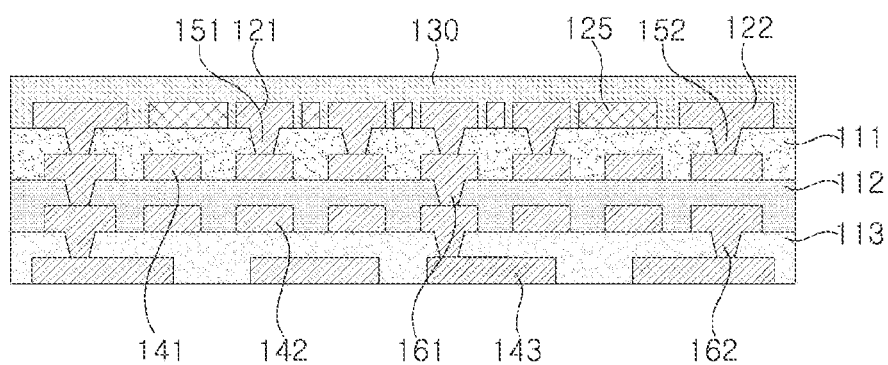

Referring to FIG. 14F, a solder resist layer 130 may be formed on the first insulating layer 111.

Figure 14G:
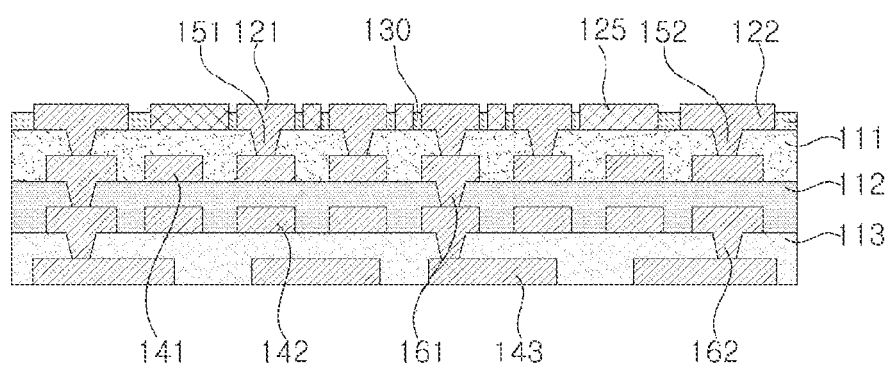

Referring to FIG. 14G, a thinning process may be performed to lower a height of the solder resist layer 130, that is, to reduce a thickness of the solder resist layer 130.

Figure 14H:
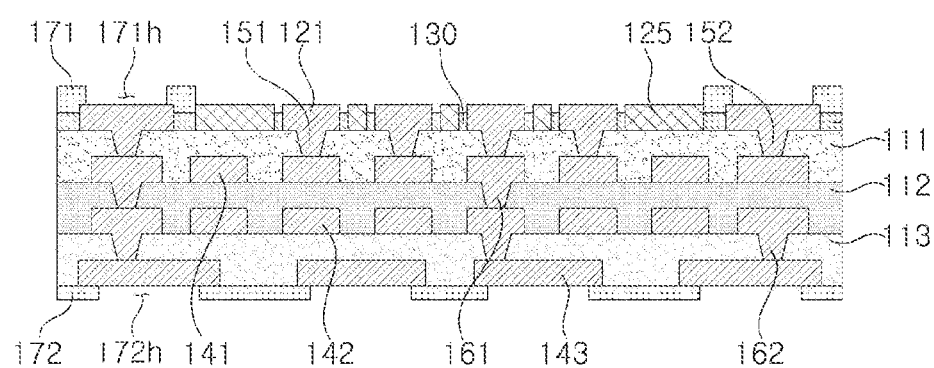

Referring to FIG. 14H, first and second passivation layers 171 and 172 may be formed. Also, first and second openings 171h and 172h may be formed.

Figure 14I:
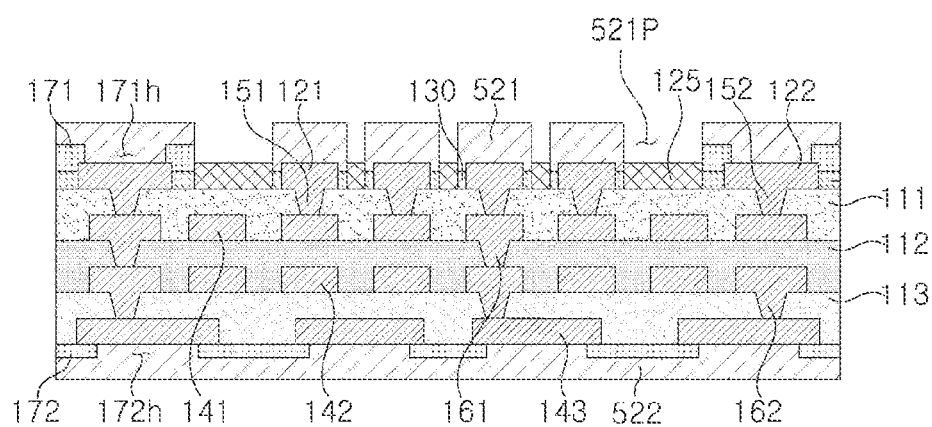

Referring to FIG. 14I, a first dry film 521 may be disposed on the first insulating layer 111 and the first passivation layer 171. In addition, a second dry film 522 may be disposed on the second passivation layer 172. Thereafter, the first dry film 521 may be patterned to form exposed portions 521p exposing the conductor patterns 125.

Figure 14J:
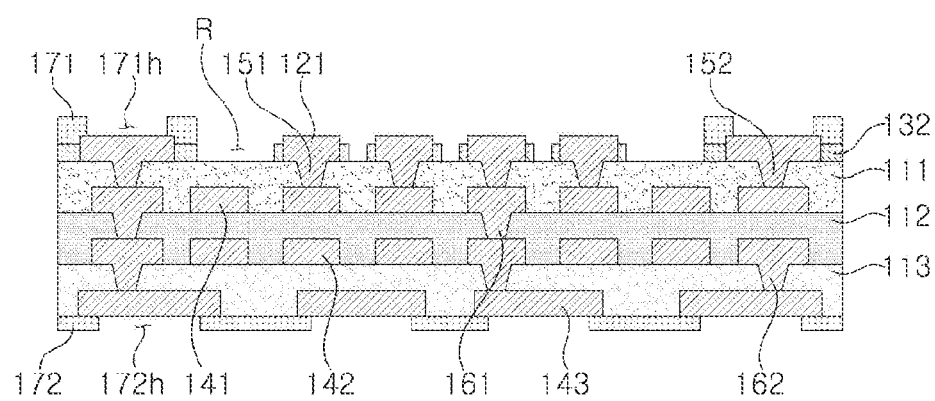

Referring to FIG. 14J, the conductor patterns 125 may be removed. By removing the conductor patterns 125, a recess R may be formed in the solder resist layer 130. A plurality of first and second insulating walls 131 and 132 at least partially covering side surfaces of the plurality of first and second pads 121 and 122, respectively, may be formed by the recess R. Thereafter, the first and second dry films 521 and 522 may be removed.

Through a series of processes, the printed circuit board 100H according to another exemplary embodiment described above may be manufactured. However, this is merely an example of a manufacturing method, and the printed circuit board 100H according to another exemplary embodiment described above may be manufactured through other processes.

The other details, for example, the details described above for the printed circuit boards 100A, 100B, 100C, 100D, 100E, 100F, 100G, and 100H and the details described above for the manufacturing methods, may be applicable to the method for manufacturing the printed circuit board 100H unless contradictory, and the overlapping description will be omitted.

Figure 15:
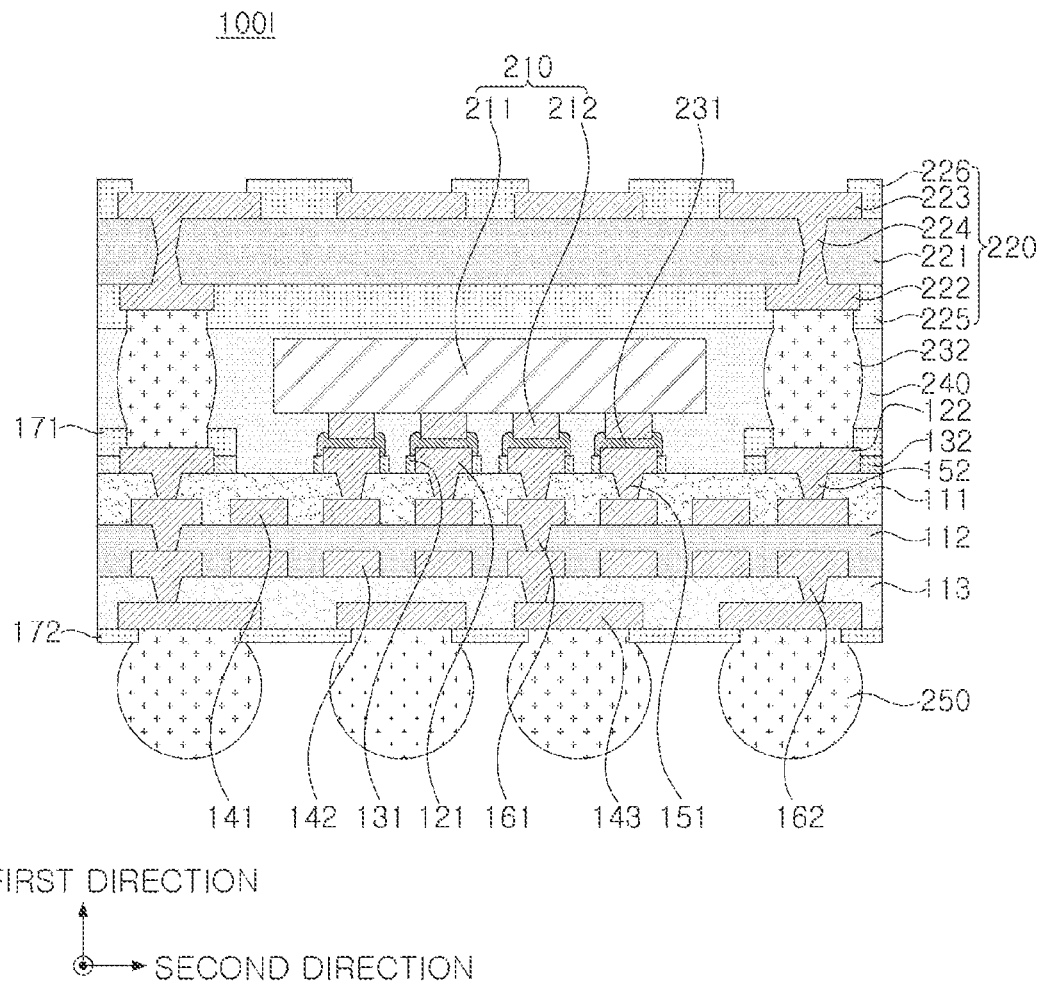
FIG. 15 is a cross-sectional view schematically illustrating a modified exemplary embodiment of the printed circuit board of FIG. 13.

FIG. 15 is a cross-sectional view schematically illustrating a modified exemplary embodiment of the printed circuit board of FIG. 13.

Referring to FIG. 15, a printed circuit board 100I according to a modified exemplary embodiment may have a package structure in which an electronic component 210 is surface-mounted on the above-described printed circuit board 100H, and then a separate wiring board 220 is disposed thereon in a board-on-board type. Here, the above-described printed circuit board 100H may be used as a package board for mounting a flip-chip die or the like.

The other details, for example, the details described above for the printed circuit boards 100A, 100B, 100C, 100D, 100E, 100F, 100G, and 100H, may be applicable to the printed circuit board 100I according to a modified exemplary embodiment unless contradictory, and the overlapping description will be omitted.

Figure 16:
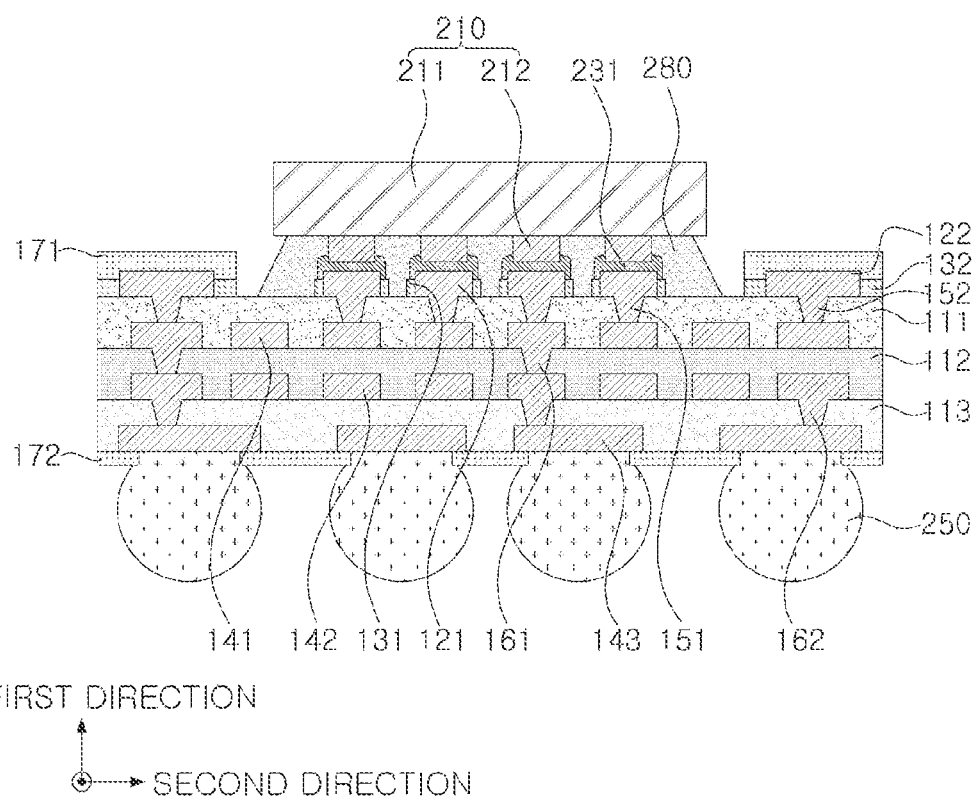
FIG. 16 is a cross-sectional view schematically illustrating another modified exemplary embodiment of the printed circuit board of FIG. 13.

FIG. 16 is a cross-sectional view schematically illustrating another modified exemplary embodiment of the printed circuit board of FIG. 13.

Referring to FIG. 16, a printed circuit board 100J according to another modified exemplary embodiment may have a package structure in which an electronic component 210 is surface-mounted on the above-described printed circuit board 100H. Here, the above-described printed circuit board 100H may be used as a package board for mounting only a flip-chip die or the like without involving a board-on-board.

The other details, for example, the details described above for the printed circuit boards 100A, 100B, 100C, 100D, 100E, 100F, 100G, 100H, and 100I, may be applicable to the printed circuit board 100J according to another modified exemplary embodiment unless contradictory, and the overlapping description will be omitted.

FIGS. 17 to 20 are plan views schematically illustrating various shapes of the plurality of pads and the plurality of insulating walls.

Figure 17:
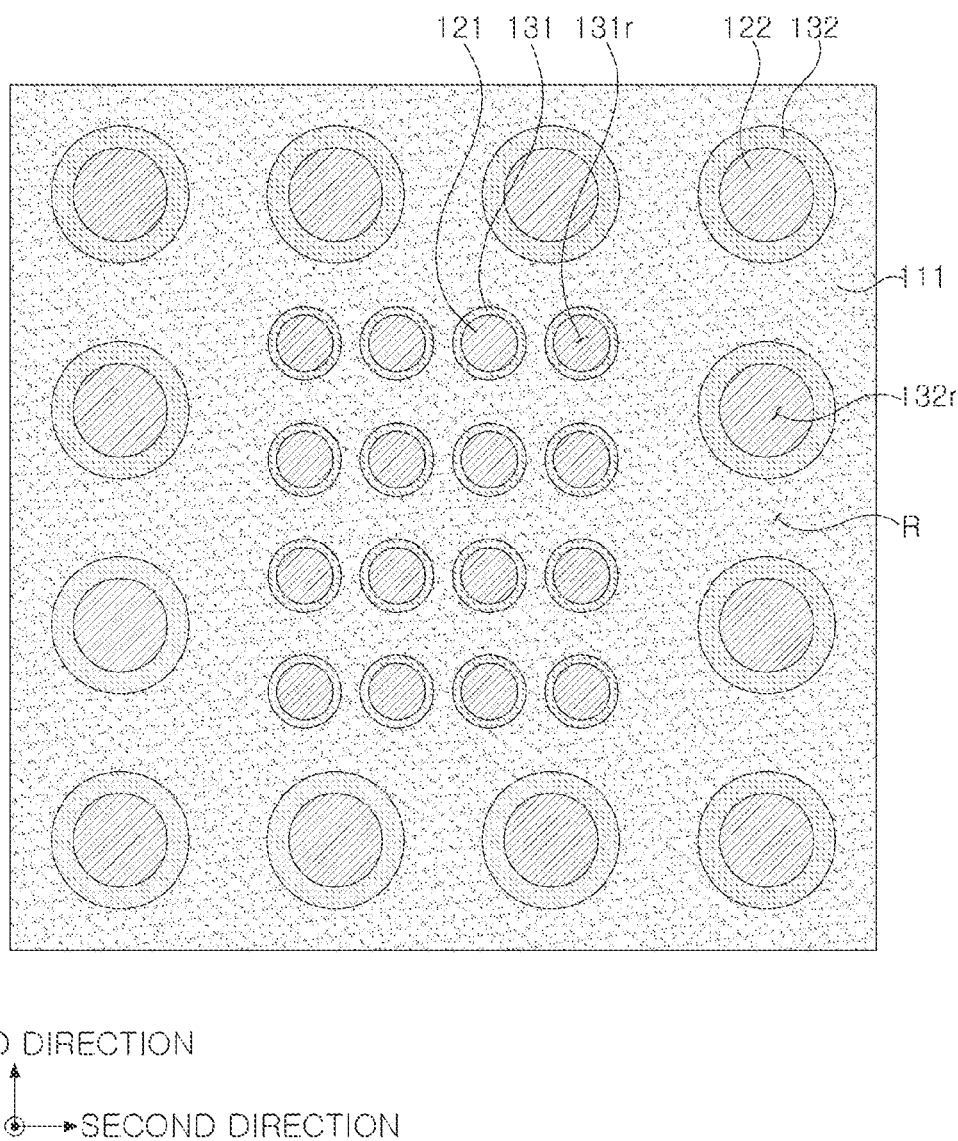
FIGS. 17 to 20 are plan views schematically illustrating various shapes of a plurality of pads and a plurality of insulating walls.

Referring to FIG. 17, based on the plan-view shape, the plurality of first pads 121 may be disposed on the center area, and the plurality of second pads 122 may be disposed on the side area surrounding the center area. The plurality of first pads 121 may be surrounded by the plurality of first insulating walls 131, respectively. The plurality of second pads 122 may be surrounded by the plurality of second insulating walls 132, respectively. The plurality of first insulating walls 131 may have first cavities 131r in which the first pads 121 are disposed, respectively. The plurality of second insulating walls 132 may have second cavities 132r in which the second pads 122 are disposed, respectively. There may be one recess R continuing as a whole between the plurality of first insulating walls 131 and the plurality of second insulating walls 132. Each of the plurality of first pads 121 and the plurality of second pads 122 may have a circular shape. Each of the plurality of first insulating walls 131 and the plurality of second insulating walls 132 may have a circular ring shape. Each of the plurality of second pads 122 may have a larger area than each of the plurality of first pads 121. For example, each of the plurality of second pads 122 may have a larger diameter than each of the plurality of first pads 121.

Figure 18:
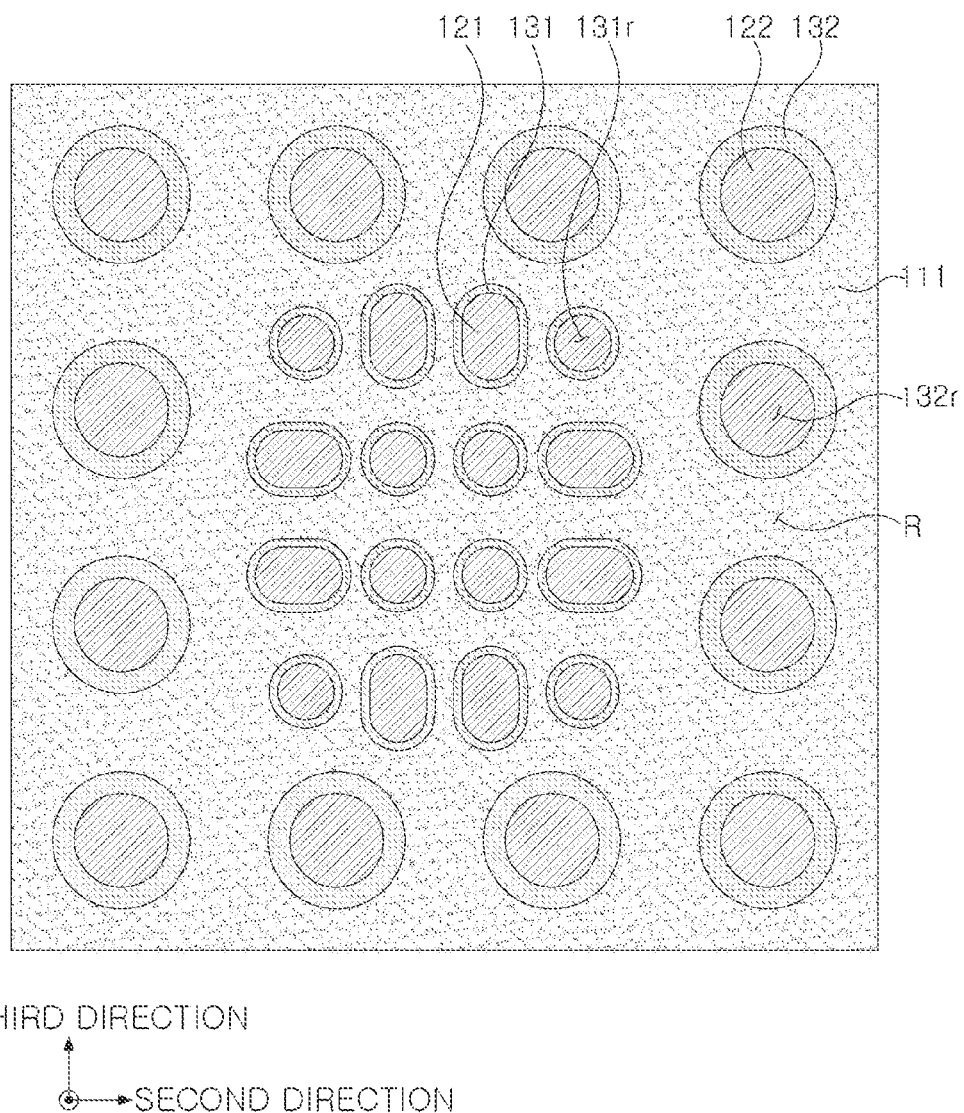

Referring to FIG. 18, based on the plan-view shape, at least one of the plurality of first pads 121 may have a shape in which a length thereof in one direction is larger than a length thereof in another direction perpendicular to the one direction. The first insulating wall 131 surrounding the same may also have a ring shape in which a length thereof in one direction is larger than a length thereof in another direction perpendicular to the one direction. In this way, the plurality of first pads 121 may be designed such that circular pads and elongated pads are mixed, based on how to connect a semiconductor die. That is, various designs are applicable. The elongated shape of the pad makes it possible to increase a contact area, thereby improving reliability.

Figure 19:
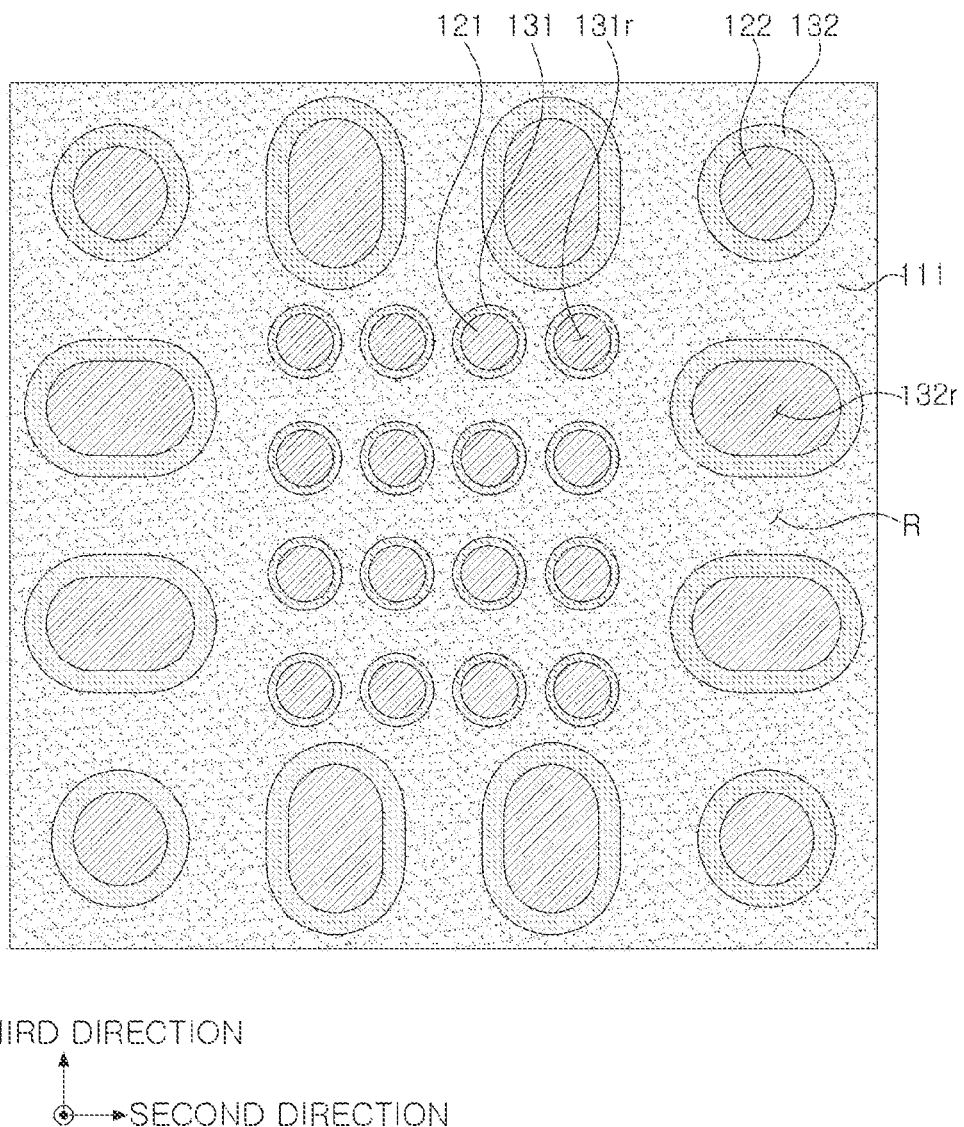

Referring to FIG. 19, based on the plan-view shape, at least one of the plurality of second pads 122 may have a shape in which a length thereof in one direction is larger than a length thereof in another direction perpendicular to the one direction. The second insulating wall 132 surrounding the same may also have a ring shape in which a length thereof in one direction is larger than a length thereof in another direction perpendicular to the one direction. In this way, the plurality of second pads 122 may be designed such that circular pads and elongated pads are mixed, based on how to connect a board-on-board. That is, various designs are applicable. The elongated shape of the pad makes it possible to increase a contact area, thereby improving reliability.

Figure 20:
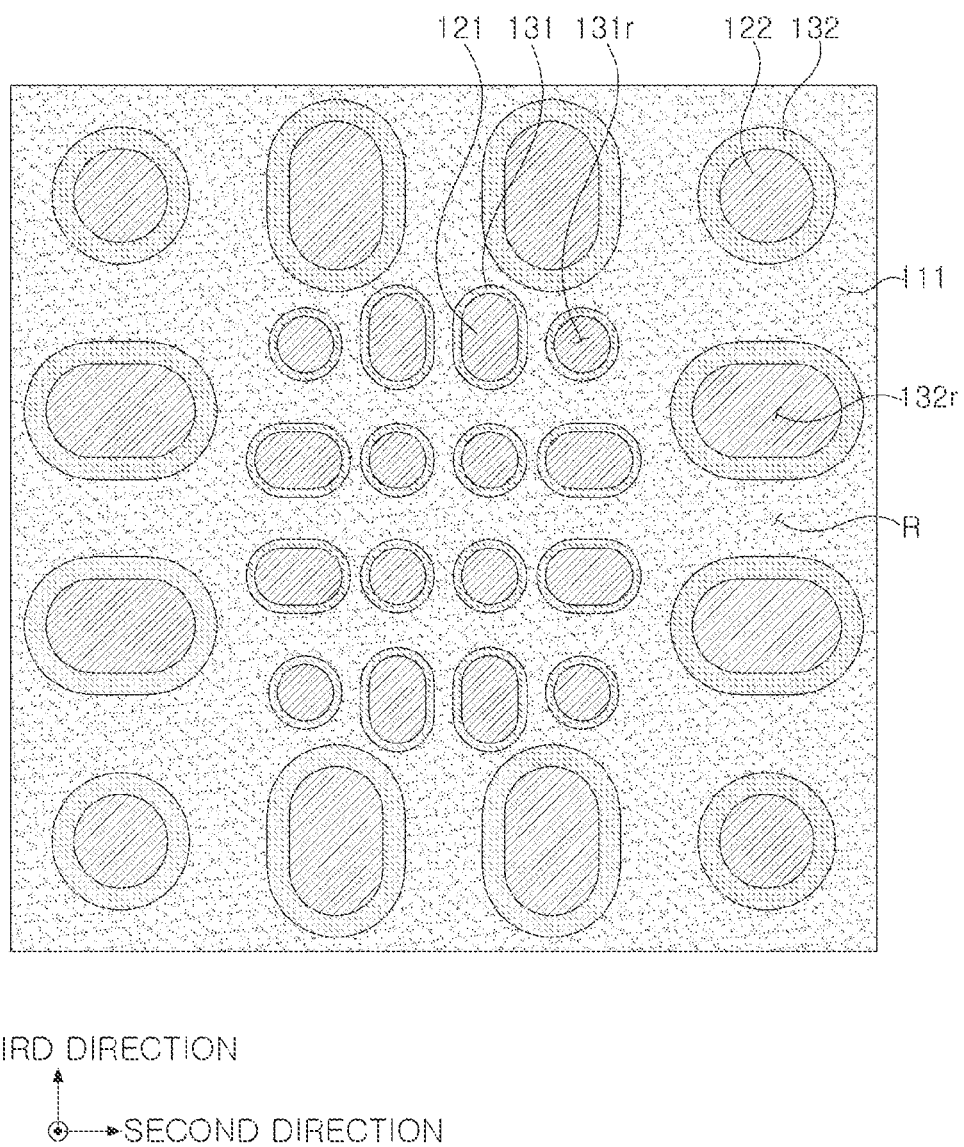

Referring to FIG. 20, based on the plan-view shape, at least one of the plurality of first pads 121 may have a shape in which a length thereof in one direction is larger than a length thereof in another direction perpendicular to the one direction. The first insulating wall 131 surrounding the same may also have a ring shape in which a length thereof in one direction is larger than a length thereof in another direction perpendicular to the one direction. At least one of the plurality of second pads 122 may have a shape in which a length thereof in one direction is larger than a length thereof in another direction perpendicular to the one direction. The second insulating wall 132 surrounding the same may also have a ring shape in which a length thereof in one direction is larger than a length thereof in another direction perpendicular to the one direction. In this way, the plurality of first pads 121 and the plurality of second pads 122 may be designed such that circular pads and elongated pads are mixed. That is, various designs are applicable. The elongated shape of the pad makes it possible to increase a contact area, thereby improving reliability.

As set forth above, as one effect of the present disclosure, it is possible to provide a printed circuit board that is easy to manufacture and a method for manufacturing the same.

As another effect of the present disclosure, it is possible to provide a printed circuit board capable of reducing a bridge short risk and a method for manufacturing the same.

As another effect of the present disclosure, it is possible to provide a printed circuit board capable of improving reliability and a method for manufacturing the same.

While exemplary embodiments have been shown and described above, it will be apparent to those skilled in the art that modifications and variations could be made without departing from the scope of the present invention as defined by the appended claims.

What is claimed is:

1. A printed circuit board comprising:
a first insulating layer;
a plurality of first pads disposed on the first insulating layer; and
a first insulating wall disposed on the first insulating layer, and having a first side surface contacting a side surface of one of the plurality of first pads to partially cover the side surface of that first pad such that a height of the first insulating wall from a top surface of the first insulating layer is less than a height of that first pad from the top surface of the first insulating layer,
wherein the first insulating wall is disposed such that a second side surface opposing the first side surface is spaced apart from a second side surface of an adjacent first insulating wall by a recess through which the first insulating layer is exposed.

2. The printed circuit board of claim 1, wherein the first insulating wall has an interface with the first insulating layer.

3. The printed circuit board of claim 1, wherein the first insulating wall includes an insulating material different from the first insulating layer.

4. The printed circuit board of claim 1, wherein the first insulating wall includes a solder resist.

5. The printed circuit board of claim 1, wherein a recess is present between adjacent first insulating walls.

6. The printed circuit board of claim 1, further comprising:
- a first wiring layer disposed on a side, opposite to a side on which the plurality of first pads and the first insulating wall are disposed, of the first insulating layer; and
- at least one connection via penetrating through the first insulating layer to connect at least one of the plurality of first pads to at least a portion of the first wiring layer,
- wherein, based on a sectional-view shape, a surface of the connection via connected to the at least one of the plurality of first pads is wider than a surface of the connection via connected to the at least a portion of the first wiring layer.

7. The printed circuit board of claim 6, wherein the first wiring layer is disposed to protrude from one surface of the first insulating layer, or the first wiring layer is at least partially embedded in the first insulating layer while one surface of the first wiring layer is at least partially exposed from the one surface of the first insulating layer.

8. The printed circuit board of claim 6, further comprising:
- a second insulating layer disposed on the first insulating layer;
- a second wiring layer disposed on the second insulating layer;
- a first via layer penetrating through the second insulating layer to at least partially connect the first and second wiring layers to each other;
- a third insulating layer disposed on the second insulating layer;
- a third wiring layer disposed on the third insulating layer; and
- a second via layer penetrating through the third insulating layer to at least partially connect the second and third wiring layers to each other,
- wherein, based on the sectional-view shape, at least one of the first and second via layers is tapered in the same direction as the connection via.

9. The printed circuit board of claim 8, wherein the second wiring layer is disposed to protrude from one surface of the second insulating layer, or the second wiring layer is at least partially embedded in the second insulating layer while one surface of the second wiring layer is at least partially exposed from the one surface of the second insulating layer, and
the third wiring layer is disposed to protrude from one surface of the third insulating layer, or the third wiring layer is at least partially embedded in the third insulating layer while one surface of the third wiring layer is at least partially exposed from the one surface of the third insulating layer.

10. The printed circuit board of claim 8, wherein the first and second insulating layers include different insulating materials, and
the first and third insulating layers include the same insulating material.

11. The printed circuit board of claim 8, wherein the first and second via layers are tapered in the same direction.

12. The printed circuit board of claim 8, wherein the first and second via layers are tapered in different directions.

13. The printed circuit board of claim 1, further comprising an electronic component disposed above the first insulating layer, and including a plurality of connection terminals connected to the first pads through first connection members, respectively.

14. The printed circuit board of claim 1, further comprising:
- a plurality of second pads disposed on the first insulating layer; and
- a plurality of second insulating walls disposed on the first insulating layer, and at least partially covering side surfaces of the plurality of second pads, respectively, while being free from surfaces of the plurality of second pads, respectively,
- wherein the first insulating wall and the plurality of second insulating walls are disposed to be spaced apart from each other on the first insulating layer,
- the plurality of first pads are disposed on a center area of the first insulating layer, and
- the plurality of second pads are disposed on a side area of the first insulating layer.

15. The printed circuit board of claim 14, further comprising a passivation layer disposed on the plurality of second insulating walls, and at least partially opening a surface of at least one of the plurality of second pads.

16. The printed circuit board of claim 15, wherein the passivation layer is spaced apart from the plurality of first pads.

17. The printed circuit board of claim 14, further comprising:
- an electronic component disposed above the first insulating layer, and including a plurality of connection terminals electrically connected to the plurality of first pads through first connection members, respectively; and
- a wiring board disposed on the electronic component, and including a plurality of connection pads electrically connected to the plurality of second pads through second connection members, respectively.

18. The printed circuit board of claim 1, wherein the plurality of first pads have lower surfaces facing the first insulating layer and upper surfaces respectively opposing the lower surfaces, and
the plurality of first insulating walls are spaced apart from the upper surfaces of the plurality of first pads, respectively.

* * * * *